US012802636B2

(12) United States Patent
Zhou et al.

(10) Patent No.: US 12,802,636 B2
(45) Date of Patent: Nov. 17, 2026

(54) DISPLAY SUBSTRATE AND DISPLAY APPARATUS

(71) Applicants: CHENGDU BOE OPTOELECTRONICS TECHNOLOGY CO., LTD., Beijing (CN); BOE TECHNOLOGY GROUP CO., LTD., Beijing (CN)

(72) Inventors: Hongjun Zhou, Beijing (CN); Taofeng Xie, Beijing (CN); Yuxin Zhang, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 120 days.

(21) Appl. No.: 18/992,803

(22) PCT Filed: Mar. 13, 2024

(86) PCT No.: PCT/CN2024/081526
§ 371 (c)(1),
(2) Date: Jan. 9, 2025

(87) PCT Pub. No.: WO2024/222277
PCT Pub. Date: Oct. 31, 2024

(65) Prior Publication Data

US 2026/0245513 A1 Aug. 20, 2026

(30) Foreign Application Priority Data

Apr. 27, 2023 (CN) ......................... 202310477789.9

(51) Int. Cl.
*G09G 3/3233* (2016.01)
*H10K 59/131* (2023.01)
*H10K 59/35* (2023.01)

(52) U.S. Cl.
CPC ......... *G09G 3/3233* (2013.01); *H10K 59/131* (2023.02); *H10K 59/353* (2023.02);
(Continued)

(58) Field of Classification Search
CPC ......... G09G 3/3233; G09G 2300/0452; H10K 59/353; H10K 59/131
(Continued)

(56) References Cited

U.S. PATENT DOCUMENTS 11,871,636 B2 * 1/2024 Lee ....................... H10K 59/352
2005/0200573 A1 * 9/2005 Kwak .................. G09G 3/3233
345/76
(Continued)

FOREIGN PATENT DOCUMENTS

CN 108831368 A 11/2018
CN 115424565 A 12/2022
(Continued)

*Primary Examiner* — Kevin M Nguyen
(74) *Attorney, Agent, or Firm* — The Webb Law Firm

(57) ABSTRACT

A display substrate includes light-emitting devices, pixel circuits, and data lines. Pixel circuit columns include first to fourth pixel circuit columns. The first and second pixel circuit columns are alternately arranged, and a third pixel circuit column or a fourth pixel circuit column is located between a first pixel circuit column and a second pixel circuit column that are adjacent. The first pixel circuit column or the third pixel circuit column is configured to drive corresponding light-emitting devices to emit first color light and second color light, and the second pixel circuit column or the fourth pixel circuit column is configured to drive corresponding light-emitting devices to emit third color light. The data lines are electrically connected to the pixel circuit columns and include a first data line electrically
(Continued)

connected to the third pixel circuit column and located between the third pixel circuit column and the second pixel circuit column.

20 Claims, 12 Drawing Sheets

(52) U.S. Cl.
CPC ............... *G09G 2300/0426* (2013.01); *G09G 2300/0819* (2013.01); *G09G 2300/0842* (2013.01); *G09G 2300/0861* (2013.01); *G09G 2310/08* (2013.01)

(58) Field of Classification Search
USPC ............................................................ 345/88
See application file for complete search history.

(56) References Cited

U.S. PATENT DOCUMENTS

| | | | | |
|---|---|---|---|---|
| 2022/0069047 | A1 | 3/2022 | Yang et al. | |
| 2023/0320145 | A1* | 10/2023 | Cheng | G09G 3/3233<br>257/91 |

FOREIGN PATENT DOCUMENTS

| | | | |
|---|---|---|---|
| CN | 115483259 | A | 12/2022 |
| WO | 2022057503 | A1 | 3/2022 |

* cited by examiner

DISPLAY SUBSTRATE AND DISPLAY APPARATUS

CROSS-REFERENCE TO RELATED APPLICATIONS

This application is the United States national phase of International Patent Application No. PCT/CN2024/081526, filed Mar. 13, 2024, and claims priority to Chinese Patent Application No. 202310477789.9, filed Apr. 27, 2023, the disclosures of which are hereby incorporated by reference in their entireties.

BACKGROUND OF THE INVENTION

Field of the Invention

The present disclosure relates to the field of display technologies, and in particular, to a display substrate and a display apparatus.

Description of Related Art

With the development of display technologies, full display with camera (FDC) has been gradually applied to display products due to its advantage of a large screen-to-body ratio. For full-screen display apparatuses, optical elements such as cameras are usually placed in a region below a display panel, which greatly increases the screen-to-body ratio.

SUMMARY OF THE INVENTION

In an aspect, a display substrate is provided. The display substrate has a first display area and a second display area, and the first display area is located on at least one side of the second display area. The display substrate includes a plurality of light-emitting devices, a plurality of pixel circuits and a plurality of data lines. The plurality of light-emitting devices include a plurality of first light-emitting devices located in the first display area and a plurality of second light-emitting devices located in the second display area. The plurality of pixel circuits are located in the first display area and electrically connected to the plurality of light-emitting devices. The plurality of pixel circuits are arranged into a plurality of pixel circuit columns, and the plurality of pixel circuit columns include a plurality of first pixel circuit columns and a plurality of second pixel circuit columns electrically connected to the plurality of first light-emitting devices and a plurality of third pixel circuit columns and a plurality of fourth pixel circuit columns electrically connected to the plurality of second light-emitting devices. The plurality of first pixel circuit columns and the plurality of second pixel circuit columns are alternately disposed in a row direction. At least one third pixel circuit column in the plurality of third pixel circuit columns or at least one fourth pixel circuit column in the plurality of fourth pixel circuit columns is located between a first pixel circuit column and a second pixel circuit column that are adjacent. The first pixel circuit column or the third pixel circuit column is configured to drive corresponding light-emitting devices to emit a first color light and a second color light, and the second pixel circuit column or the fourth pixel circuit column is configured to drive corresponding light-emitting devices to emit a third color light. The plurality of data lines are located in the first display area and electrically connected to the plurality of pixel circuit columns. The plurality of data lines include a first data line electrically connected to one of the at least one third pixel circuit column, and the first data line is located between the third pixel circuit column and the second pixel circuit column.

In some embodiments, first light-emitting devices electrically connected to the first pixel circuit column adjacent to the third pixel circuit column constitute target light-emitting devices. An orthographic projection of the first data line on a plane where the display substrate is located and an orthographic projection of one of the target light-emitting devices on the plane where the display substrate is located have no overlap.

In some embodiments, a portion of the first data line adjacent to the target light-emitting device is in a shape of a straight line; or a portion of the first data line adjacent to the target light-emitting device bypasses at least a portion of an edge of the target light-emitting device.

In some embodiments, first light-emitting devices electrically connected to the first pixel circuit column adjacent to the third pixel circuit column constitute target light-emitting devices. An orthographic projection of the first data line on a plane where the display substrate is located and an orthographic projection of one of the target light-emitting devices on the plane where the display substrate is located overlap partially. The display substrate further includes shielding patterns, one of the shielding patterns is located between the first data line and the target light-emitting device in a direction perpendicular to the plane where the display substrate is located, and the shielding pattern is configured to receive a constant voltage electrical signal.

In some embodiments, orthographic projections of the shielding pattern, the target light-emitting device and the first data line on the plane where the display panel is located overlap partially.

In some embodiments, the first color light is a red light, a second color light is a blue light, and a third color light is a green light. A target light-emitting device for emitting the red light constitutes a red target light-emitting device, a target light-emitting device for emitting the blue light constitutes a blue target light-emitting device, and an area of the red target light-emitting device is less than that of the blue target light-emitting device. In the direction perpendicular to the plane where the display substrate is located, the shielding pattern is located between the blue target light-emitting device and the first data line, and orthographic projections of the shielding pattern, the blue target light-emitting device and the first data line on the plane where the display substrate is located overlap partially.

In some embodiments, at least two shielding patterns are connected to be of an integrated structure.

In some embodiments, the display substrate further includes a plurality of first voltage signal lines located in the first display area, and the plurality of first voltage signal lines are respectively electrically connected to the plurality of pixel circuit columns. The display substrate includes a first conductive layer and a second conductive layer. The first conductive layer includes the plurality of data lines and the plurality of first voltage signal lines. The second conductive layer is located between the first conductive layer and the plurality of light-emitting devices. The second conductive layer includes the shielding patterns, and the shielding pattern is electrically connected to at least one first voltage signal line in the plurality of first voltage signal lines.

In some embodiments, an orthographic projection of a first light-emitting device electrically connected to the second pixel circuit column adjacent to the third pixel circuit column on a plane where the display substrate is located and an orthographic projection of the first data line on the plane where the display substrate is located overlap partially.

In some embodiments, the plurality of light-emitting devices are arranged in a plurality of light-emitting device columns; and at least one light-emitting device column includes multiple first light-emitting devices located in the first display area and multiple second light-emitting devices located in the second display area. A data line electrically connected to a pixel circuit column electrically connected to multiple first light-emitting devices in each light-emitting device column in the at least one light-emitting device column is connected to a data line electrically connected to a pixel circuit column electrically connected to multiple second light-emitting devices in the light-emitting device column in the at least one light-emitting device column.

In some embodiments, at least one third pixel circuit column and at least one fourth pixel circuit column are disposed on a side of the second display area in the row direction. The fourth pixel circuit column is closer to the second display area than the third pixel circuit column.

In another aspect, a display substrate is provided. The display substrate has a first display area and a second display area, and the first display area is located on at least one side of the second display area. The display substrate includes a plurality of light-emitting devices, a plurality of pixel circuits, a plurality of data lines and shielding patterns. The plurality of light-emitting devices include a plurality of first light-emitting devices located in the first display area and a plurality of second light-emitting devices located in the second display area. The plurality of pixel circuits are located in the first display area and electrically connected to the plurality of light-emitting devices. The plurality of pixel circuits are arranged into a plurality of pixel circuit columns, and the plurality of pixel circuit columns include a plurality of first pixel circuit columns and a plurality of second pixel circuit columns electrically connected to the plurality of first light-emitting devices and a plurality of third pixel circuit columns and a plurality of fourth pixel circuit columns electrically connected to the plurality of second light-emitting devices. The plurality of first pixel circuit columns and the plurality of second pixel circuit columns are alternately disposed in a row direction. At least one third pixel circuit column in the plurality of third pixel circuit columns or at least one fourth pixel circuit column in the plurality of fourth pixel circuit columns is located between a first pixel circuit column and a second pixel circuit column that are adjacent. The first pixel circuit column or the third pixel circuit column is configured to drive corresponding light-emitting devices to emit a first color light and a second color light, and the second pixel circuit column or the fourth pixel circuit column is configured to drive corresponding light-emitting devices to emit a third color light. The plurality of data lines are located in the first display area and electrically connected to the plurality of pixel circuit columns. The plurality of data lines include a first data line electrically connected to one of the at least one third pixel circuit column. First light-emitting devices electrically connected to the first pixel circuit column adjacent to the third pixel circuit column constitute target light-emitting devices. An orthographic projection of the first data line on a plane where the display substrate is located and an orthographic projection of one of the target light-emitting devices on the plane where the display substrate is located overlap partially. One of the shielding patterns is located between the first data line and the target light-emitting device in a direction perpendicular to the plane where the display substrate is located, and the shielding pattern is configured to receive a constant voltage electrical signal.

In some embodiments, orthographic projections of the shielding pattern, the target light-emitting device and the first data line on the plane where the display panel is located overlap partially.

In some embodiments, the first color light is a red light, a second color light is a blue light, and a third color light is a green light. A target light-emitting device for emitting the red light constitutes a red target light-emitting device, a target light-emitting device for emitting the blue light constitutes a blue target light-emitting device, and an area of the red target light-emitting device is less than an area of the blue target light-emitting device. In the direction perpendicular to the plane where the display substrate is located, the shielding pattern is located between the red target light-emitting device and the first data line; and orthographic projections of the shielding pattern, the red target light-emitting device and the first data line on the plane where the display substrate is located overlap partially.

In some embodiments, at least two shielding patterns are connected to be of an integrated structure.

In some embodiments, the display substrate further includes a plurality of first voltage signal lines located in the first display area, and the plurality of first voltage signal lines are respectively electrically connected to the plurality of pixel circuit columns. The display substrate includes a first conductive layer and a second conductive layer. The first conductive layer includes the plurality of data lines and the plurality of first voltage signal lines. The second conductive layer is located between the first conductive layer and the plurality of light-emitting devices. The second conductive layer includes the shielding patterns, and the shielding pattern is electrically connected to at least one first voltage signal line in the plurality of first voltage signal lines.

In some embodiments, the first data line is located between the third pixel circuit column and the first pixel circuit column.

In some embodiments, the plurality of light-emitting devices are arranged in a plurality of light-emitting device columns; at least one light-emitting device column includes multiple first light-emitting devices located in the first display area and multiple second light-emitting devices located in the second display area. A data line electrically connected to a pixel circuit column electrically connected to multiple first light-emitting devices in each light-emitting device column in the at least one light-emitting device column is connected to a data line electrically connected to a pixel circuit column electrically connected to multiple second light-emitting devices in the light-emitting device column in the at least one light-emitting device column.

In some embodiments, at least one third pixel circuit column and at least one fourth pixel circuit column are disposed on a side of the second display area in the row direction; and the fourth pixel circuit column is closer to the second display area than the third pixel circuit column.

In yet another aspect, a display substrate is provided. The display substrate has a first display area and a second display area, and the first display area is located on at least one side of the second display area. The display substrate includes a plurality of light-emitting devices, a plurality of pixel circuits and a plurality of data lines. The plurality of light-emitting devices include a plurality of first light-emitting devices located in the first display area and a plurality of second light-emitting devices located in the second display area. The plurality of pixel circuits are located in the first display area and electrically connected to the plurality of light-emitting devices. The plurality of pixel circuits are arranged into a plurality of pixel circuit columns, and the plurality of pixel circuit columns include a plurality of first pixel circuit columns and a plurality of second pixel circuit columns electrically connected to the plurality of first light-emitting devices and a plurality of third pixel circuit columns and a plurality of fourth pixel circuit columns electrically connected to the plurality of second light-emitting devices. The plurality of first pixel circuit columns and the plurality of second pixel circuit columns are alternately disposed in a row direction. At least one third pixel circuit column in the plurality of third pixel circuit columns or at least one fourth pixel circuit column in the plurality of fourth pixel circuit columns is located between a first pixel circuit column and a second pixel circuit column that are adjacent. The first pixel circuit column or the third pixel circuit column is configured to drive corresponding light-emitting devices to emit a first color light and a second color light, and the second pixel circuit column or the fourth pixel circuit column is configured to drive corresponding light-emitting devices to emit a third color light. The plurality of data lines are located in the first display area and electrically connected to the plurality of pixel circuit columns. The plurality of data lines include a first data line electrically connected to one of the at least one third pixel circuit column. First light-emitting devices electrically connected to the first pixel circuit column adjacent to the third pixel circuit column constitute target light-emitting devices. An orthographic projection of the first data line on a plane where the display substrate is located and an orthographic projection of one of the target light-emitting devices on the plane where the display substrate is located have no overlap.

In some embodiments, a portion of the first data line adjacent to the target light-emitting device is in a shape of a straight line; or a portion of the first data line adjacent to the target light-emitting device bypasses at least a portion of an edge of the target light-emitting device.

In some embodiments, an orthographic projection of a first light-emitting device electrically connected to the second pixel circuit column adjacent to the third pixel circuit column on a plane where the display substrate is located and an orthographic projection of the first data line on the plane where the display substrate is located overlap partially.

In some embodiments, the plurality of light-emitting devices are arranged in a plurality of light-emitting device columns; at least one light-emitting device column multiple first light-emitting devices located in the first display area and multiple second light-emitting devices located in the second display area. A data line electrically connected to a pixel circuit column electrically connected to multiple first light-emitting devices in each light-emitting device column in the at least one light-emitting device column is connected to a data line electrically connected to a pixel circuit column electrically connected to multiple second light-emitting devices in the light-emitting device column in the at least one light-emitting device column.

In some embodiments, at least one third pixel circuit column and at least one fourth pixel circuit column are disposed on a side of the second display area in the row direction; and the fourth pixel circuit column is closer to the second display area than the third pixel circuit column.

In yet another aspect, a display apparatus is provided. The display apparatus includes: the display substrate as described in any of the above embodiments; and an optical element located on a non-light-exit side of the display substrate. The optical element is at least partially located in the second display area of the display substrate.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product to which the embodiments of the present disclosure relate.

DESCRIPTION OF THE INVENTION

Figure 1:
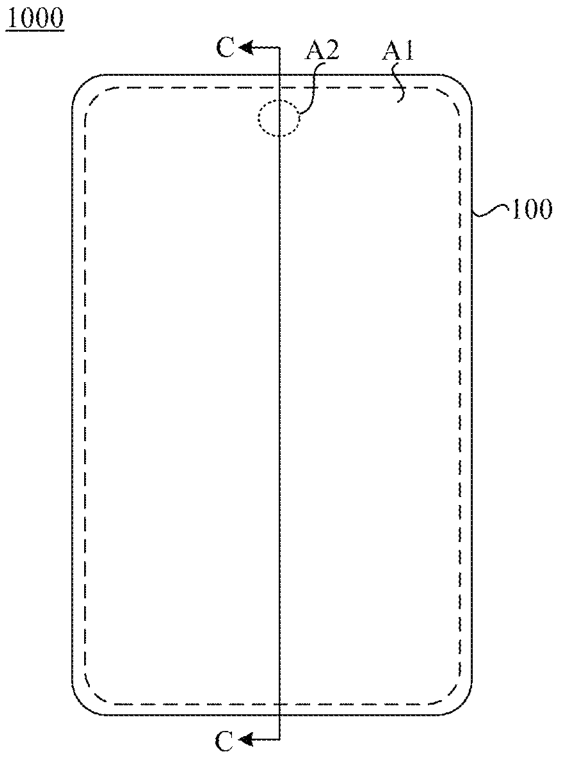
FIG. 1 is a structural diagram of a display apparatus, in accordance with some embodiments.

Technical solutions in some embodiments of the present disclosure will be described clearly and completely with reference to the accompanying drawings below.

Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "connected" and derivatives thereof may be used. The term "connection" should be understood in a broad sense. For example, the "connection" may be a fixed connection, a detachable connection, or of an integrated structure; it may be a direct connection or an indirect connection by an intermediate medium. The embodiments disclosed herein are not necessarily limited to the content herein.

The phrase "A and/or B" includes the following three combinations: only A, only B, and a combination of A and B.

The phrase "applicable to" or "configured to" as used herein indicates an open and inclusive expression, which does not exclude apparatuses that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term "about", "substantially" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

The term such as "parallel" and "perpendicular" as used herein includes a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term "parallel" includes absolute parallelism and approximate parallelism, and an acceptable range of deviation of the approximate parallelism may be a deviation within 5°; and the term "perpendicular" includes absolute perpendicularity and approximate perpendicularity, and an acceptable range of deviation of the approximate perpendicularity may also be a deviation within 5°.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plane views as idealized exemplary drawings. In the accompanying drawings, thicknesses of layers and sizes of areas/regions are enlarged for clarity. Variations in shapes relative to the accompanying drawings due to, for example, manufacturing technologies and/or tolerances may be envisaged. Therefore, the exemplary embodiments should not be construed to be limited to the shapes of areas/regions shown herein, but to include deviations in the shapes due to, for example, manufacturing. For example, an etched area/region shown in a rectangular shape generally has a feature of being curved. Therefore, the areas/regions shown in the accompanying drawings are schematic in nature, and their shapes are not intended to show actual shapes of the areas/regions in a device, and are not intended to limit the scope of the exemplary embodiments.

In circuit structures (e.g., a pixel circuit) provided in embodiments of the present disclosure, transistors used in the circuit structure may be thin film transistors (TFTs), field effect transistors (e.g., metal oxide semiconductor (MOS) transistors), or other switching devices with same properties, and the embodiments of the present disclosure are described by considering the thin film transistors as an example.

In circuit structures provided in embodiments of the present disclosure, a first electrode of each transistor used is one of a source and a drain, and a second electrode of the transistor used is another of the source and the drain. Since the source and the drain of the transistor may be symmetrical in structure, the source and the drain may be structurally indistinguishable. That is, the first electrode and the second electrode of the transistor in the embodiments of the present disclosure may be indistinguishable in structure. For example, in a case where the transistor is a P-type transistor, the first electrode of the transistor is the source and the second electrode of the transistor is the drain. For example, in a case where the transistor is an N-type transistor, the first electrode of the transistor is the drain, and the second electrode of the transistor is the source.

In circuit structures provided in the embodiments of the present disclosure, a first node, a second node and the like do not represent actual components, but rather represent junctions of related electrical connections in a circuit diagram. That is, these nodes are nodes equivalent to the junctions of the related electrical connections in the circuit diagram.

Transistors included in the circuit structures provided in the embodiments of the present disclosure may all be N-type transistors or all be P-type transistors, or some are N-type transistors and the other are P-type transistors.

The following will be described by considering an example where the transistors included in the circuit structures provided by the embodiments of the present disclosure are all P-type transistors.

Some embodiments of the present disclosure provide a display apparatus. The display apparatus may be any product or component with display and image acquisition functions, such as a mobile phone, a tablet computer, a desktop computer, a laptop computer, a handheld computer, a notebook computer, an ultra-mobile personal computer, an artificial intelligence device, a smart wearable device, a vehicle-mounted device, a smart home device and/or a smart city device.

The embodiments of the present disclosure do not make any special limitations on the specific form of the above display apparatus. For convenience of illustration, the following will be described by considering an example where the display apparatus is a mobile phone.

Figure 2:
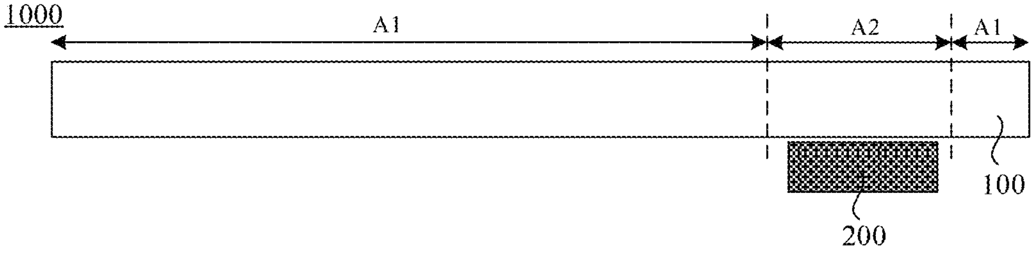
FIG. 2 is a sectional view of the display apparatus shown in FIG. 1 taken along a C-C direction.

FIG. 1 shows a top view of a structure of a display apparatus, and FIG. 2 shows a sectional view of a structure of the display apparatus shown in FIG. 1 taken along the C-C direction.

The display apparatus 1000 includes a display substrate 100. The display substrate 100 is, for example, an organic light-emitting diode (OLED) display panel, a quantum dot light-emitting diode (QLED) display substrate, or the like. The following will be described by considering an example where the display substrate 100 is the OLED display substrate.

The display substrate 100 has a first display area A1 and a second display area A2. The first display area A1 is located on at least one side of the second display area A2, and the first display area A1 at least partially surrounds the second display area A2. For example, an area of the first display area A1 is greater than an area of the second display area A2.

Here, there may be at least one second display area A2, and there is, for example, one first display area A1. As shown in FIG. 1, the structure of the display substrate 100 will be schematically described by considering an example where there is one second display area A2.

For example, the first display area A1 may surround the second display area A2. In this case, the second display area A2 may be, for example, in a shape of a circle, an ellipse, or a rectangle.

As another example, the first display area A1 may surround part of the second display area A2, that is, a portion of an edge of the first display area A1 coincides with a portion of an edge of the second display area A2. In this case, the second display area A2 may be, for example, in a shape of a rectangle, a rectangle with rounded corners, a water droplet or a semicircle.

For example, a light transmittance of a portion of the display substrate 100 located in the first display area A1 is less than a light transmittance of a portion of the display substrate 100 located in the second display area A2. In this way, external light can pass through the portion of the display substrate 100 located in the second display area A2 from a side of the display substrate 100 to enter the other side of the display substrate 100.

As shown in FIG. 2, the display apparatus 1000 further includes an optical element 200. The optical element 200 is disposed on a non-light-exit side of the display substrate 100. The display substrate 100 has a display side for displaying images, and the non-light-exit side is a side opposite to the display side.

Optionally, the optical element 200 may include a photosensitive device. For example, the photosensitive device may include an image collector (e.g., a camera) or an infrared receiver. In addition, the number of the optical elements 200 may be set depending on actual needs.

For example, the optical element 200 is at least partially located in the second display area A2. That is, the entire optical element 200 may be located in the second display area A2. Alternatively, a portion of the optical element 200 is located in the second display area A2, and the other portion of the optical element 200 is located outside the second display area A2; accordingly, the optical element 200 and the second display area A2 are provided in a staggered manner.

The light transmittance of the portion of the display substrate 100 located in the first display area A1 is less than the light transmittance of the portion of the display substrate 100 located in the second display area A2. Therefore, the external light can pass through the portion of the display substrate 100 located in the second display area A2 to enter the optical element 200, so that the optical element 200 can work.

The description is made by considering an example in which the optical element 200 is a camera.

For example, when the optical element 200 does not work, the portion of the display substrate 100 located in the second display area A2 may perform display, so that the entire display substrate 100 and the entire display apparatus 1000 can display images.

As another example, when the optical element 200 works (e.g., the user takes a selfie), the portion of the display substrate 100 located in the second display area A2 may present a black image, and the portion of the display substrate 100 located in the first display area A1 presents the user's selfie image, and clearly shows the location of the optical element 200. Alternatively, the entire display substrate 100 located in the first display area A1 and the second display area A2 may present the user's selfie image without showing the location of the optical element 200.

The embodiments of the present disclosure sets the light transmittance of the portion of the display substrate 100 located in the second display area A2 and provides the optical element 200 in the second display area A2. As a result, a normal work of the optical element 200 may be ensured, and a display area of the display substrate 100 and a display area of the display apparatus 1000 may increase, thereby increasing the screen-to-body ratio.

Optionally, the display apparatus 1000 may further include a frame for accommodating the display substrate 100 and the optical element 200, and a circuit board, a display driver integrated circuit (IC) and other electronic components that are provided in the frame.

Figure 3:
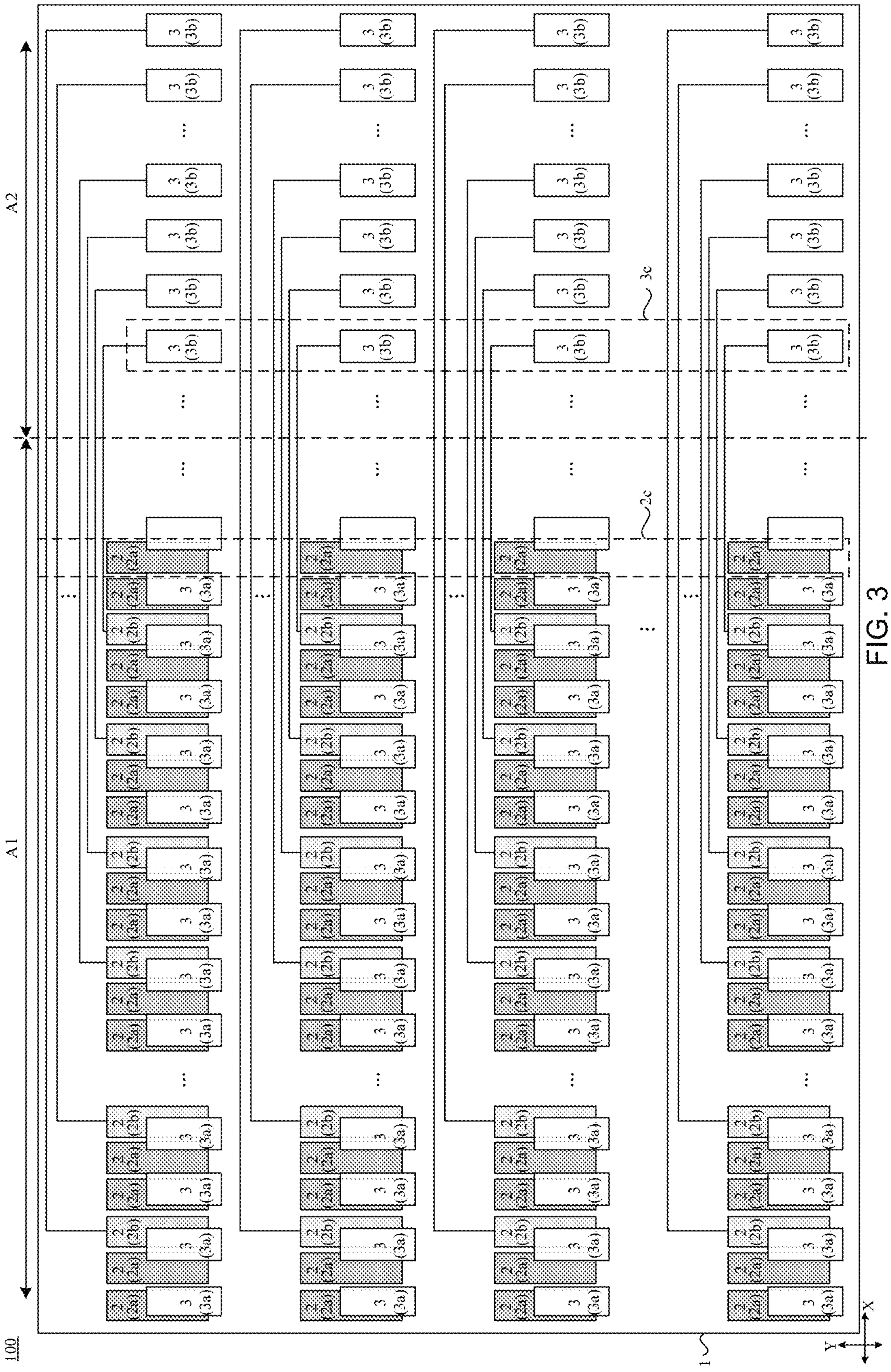
FIG. 3 is a structural diagram of a display substrate, in accordance with some embodiments.

FIG. 3 shows a structure of the display substrate.

The display substrate 100 includes a substrate 1, a plurality of pixel circuits 2 and a plurality of light-emitting devices 3. The plurality of pixel circuits 2 are located on the substrate 1, and the plurality of light-emitting device 3 are located on a side of the plurality of pixel circuits 2 away from the substrate 1.

The plurality of pixel circuits 2 and the plurality of light-emitting devices 3 are electrically connected. For example, an electrical connection method between the plurality of pixel circuits 2 and the plurality of light-emitting devices 3 includes, but is not limited to, that the pixel circuits 2 and the light-emitting devices 3 are electrically connected in one-to-one correspondence. A structure of the pixel circuit 2 varies, and may be provided depending on actual needs. For example, the structure of the pixel circuit 2 includes, but is not limited to, a structure of "6T1 C", "7T C", "6T2C", "7T2C" or the like. Here, "T" represents a transistor, the number preceding "T" represents the number of the transistor(s), "C" represents a storage capacitor, and the number preceding "C" represents the number of the storage capacitor(s).

Figure 4:
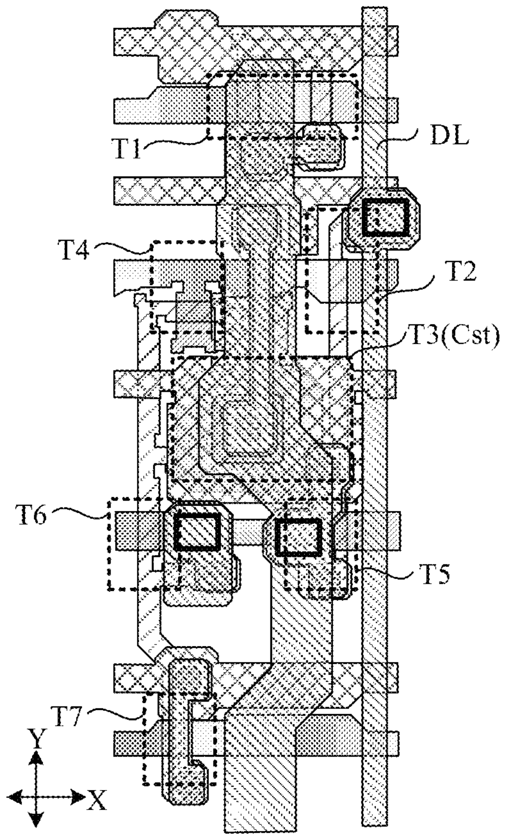
FIG. 4 is a diagram showing a film layer structure of a pixel circuit, in accordance with some embodiments.
Figure 5:
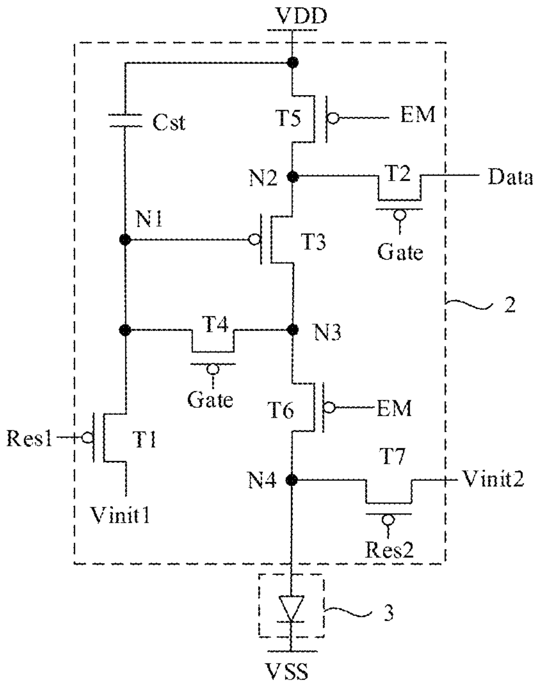
FIG. 5 is an equivalent circuit diagram of a pixel circuit and a light-emitting device, in accordance with some embodiments.

The description is made by considering an example where the structure of the pixel circuit 2 is a "7T1C" structure. FIG. 4 shows a film layer structure of a pixel circuit 2. FIG. 5 shows an equivalent circuit structure of a pixel circuit 2 and a light-emitting device 3. The pixel circuit 2 includes: a first reset transistor T1, a switching transistor T2, a driving transistor T3, a compensation transistor T4, a first light-emitting control transistor T5, a second light-emitting control transistor T6, a second reset transistor T7 and a storage capacitor Cst.

In combination with FIGS. 4 and 5, a gate of the first reset transistor T1 is electrically connected to a first reset signal terminal Res1, a first electrode of the first reset transistor T1 is electrically connected to a first initial signal terminal Vinit1, and a second electrode of the first reset transistor T1 is electrically connected to a first node N1. A gate of the switching transistor T2 is electrically connected to a scanning signal terminal Gate, a first electrode of the switching transistor T2 is electrically connected to a data signal terminal Data, and a second electrode of the switching transistor T2 is electrically connected to a second node N2. A gate of the driving transistor T3 is electrically connected to the first node N1, a first electrode of the driving transistor T3 is electrically connected to the second node N2, and a second electrode of the driving transistor T3 is electrically connected to a third node N3. A gate of the compensation transistor T4 is electrically connected to the scanning signal terminal Gate, a first electrode of the compensation transistor T4 is electrically connected to the third node N3, and a second electrode of the compensation transistor T4 is electrically connected to the first node N1. A gate of the first light-emitting control transistor T5 is electrically connected to an enable signal terminal EM, a first electrode of the first light-emitting control transistor T5 is electrically connected to a first voltage signal terminal VDD, and a second electrode of the first light-emitting control transistor T5 is electrically connected to the second node N2. A gate of the second light-emitting control transistor T6 is electrically connected to the enable signal terminal EM, a first electrode of the second light-emitting control transistor T6 is electrically connected to the third node N3, and a second electrode of the second light-emitting control transistor T6 is electrically connected to a fourth node N1. A gate of the second reset transistor T7 is electrically connected to a second reset signal terminal Res2, a first electrode of the second reset transistor T7 is electrically connected to a second initial signal terminal Vinit2, and a second electrode of the second reset transistor T7 is electrically connected to the fourth node N4. A first end of the storage capacitor Cst is electrically connected to the first node N1, and a second end of the storage capacitor Cst is electrically connected to the first voltage signal terminal VDD. An anode of the light-emitting device 3 is electrically connected to the fourth node N4, and a cathode of the light-emitting device 3 is electrically connected to a second voltage signal terminal VSS.

During working of the pixel circuit 2, the first reset transistor T1 may be turned on under control of a first reset signal transmitted by the first reset signal terminal Res1 to transmit a first initial signal transmitted by the first initial signal terminal Vinit1 to the first node N1. The second reset transistor T7 may be turned on under control of a second reset signal transmitted by the second reset signal terminal Res2 to transmit a second initial signal transmitted by the second initial signal terminal Vinit2 to the fourth node N4.

Then, the switching transistor T2 and the compensation transistor t4 may be turned on under control of a scanning signal transmitted by the scanning signal terminal Gate to transmit a data signal transmitted by the data signal terminal Data to the first node N1 through the switching transistor T2, the driving transistor T3 and the compensation transistor T4 sequentially, so as to achieve compensation of the threshold voltage.

Then, the first light-emitting control transistor T5 and the second light-emitting control transistor T6 may be turned on under control of an enable signal transmitted by the enable signal terminal EM, and the driving transistor T3 generates a driving signal based on a potential at the first node N1 and a first voltage signal provided by the first voltage signal terminal VDD.

A driving signal generated by each pixel circuit 2 is transmitted to a corresponding light-emitting device 3 to control an emission state (e.g., brightness and whether to emit light) of the light-emitting device 3. The plurality of light-emitting devices 3 cooperate with each other to enable the display substrate 100 to achieve image display.

The plurality of light-emitting devices 3 may emit lights of a plurality of colors. For example, the lights of the plurality of colors may be a first color light, a second color light and a third color light. As another example, the lights of the plurality of colors may be a first color light, a second color light, a third color light and a fourth color light. Optionally, one of the first color light and the second color light is red light, and the other thereof is blue light, the third color light is green light, and the fourth color light is white light. Different light-emitting devices 3 cooperate with each other to enable the display substrate 100 to display color images.

It can be understood that there are many ways to implement that the light transmittance of the portion of the display substrate 100 located in the first display area A1 is less than the light transmittance of the portion of the display substrate 100 located in the second display area A2, and selection may be made depending on actual needs.

For example, the plurality of light-emitting devices 3 include a plurality of first light-emitting devices 3*a* located in the first display area A1 and a plurality of second light-emitting devices 31*b* located in the second display area A2. The plurality of pixel circuits 2 include a first pixel circuit 2*a* electrically connected to each first light-emitting device 3*a* and a second pixel circuit 2*b* electrically connected to each second light-emitting device 3*b*.

For example, the first pixel circuits 2*a* are located in the first display area A1, and the second pixel circuits 2*b* are located in the second display area A2. Furthermore, a distribution density of the second pixel circuits 2*b* is less than a distribution density of the first pixel circuits 2*a* (it may also be considered that a distribution density of the second light-emitting devices 3*b* is less than a distribution density of the first light-emitting devices 3*a*). In this way, a distance between two adjacent pixel circuits 2 or two adjacent light-emitting devices 3 in the second display area A2 may increase, thereby increasing the light transmittance of the portion of the display substrate 100 located in the second display area A2.

As another example, the first pixel circuits 2*a* are located in the first display area A1, and the second pixel circuits 2*b* are located in an area outside the second display area A2 (e.g., the second pixel circuits 2*b* are located in the first display area A1 or a frame area). In this way, a structure capable of blocking light in the second display area A2 may be reduced, thereby increasing the light transmittance of the portion of the display substrate 100 located in the second display area A2. In this case, the distribution density of the first light-emitting devices 3*a* and the distribution density of the second light-emitting devices 3*b* may be the same or different.

The embodiment of the present disclosure is described by considering an example where each first pixel circuit 2*a* and each second pixel circuit 2*b* are both located in the first display area A1, and the distribution density of the first light-emitting devices 3*a* is the same as the distribution density of the second light-emitting devices 3*b*.

For example, the plurality of light-emitting devices 3 may emit a first color light, a second color light and a third color light, and an arrangement of the plurality of light-emitting devices 3 varies.

For example, as shown in FIG. 3, the plurality of light-emitting devices 3 are arranged in a plurality of rows and a plurality of columns. The plurality of columns of light-emitting devices 3 are sequentially arranged in a first direction X, and each column of light-emitting devices 3 includes multiple light-emitting devices 3 sequentially arranged in a second direction Y. The plurality of rows of light-emitting devices 3 are sequentially arranged in the second direction Y, and each row of light-emitting devices 3 includes multiple light-emitting devices 3 sequentially arranged in the first direction X. The first direction X and the second direction Y are both parallel to the substrate 1, and have an included angle therebetween. For example, the first direction X and the second direction Y are perpendicular to each other.

Colors of lights emitted by the light-emitting devices 3 in the same column may be the same or different. Colors of lights emitted by the light-emitting devices 3 in the same row may be the same or different.

Optionally, the colors of the lights emitted by the light-emitting devices 3 in the same row are different. For example, in the light-emitting devices 3 in the same row, a light-emitting device 3 for emitting a first color light, a light-emitting device 3 for emitting a third color light, a light-emitting device 3 for emitting a second color light and a light-emitting device 3 for emitting a third color light are arranged periodically. As another example, in the light-emitting devices 3 in the same row, a light-emitting device 3 for emitting a first color light, a light-emitting device 3 for emitting a second color light and a light-emitting device 3 for emitting a third color light are arranged periodically.

Optionally, the colors of the lights emitted by the light-emitting devices 3 in the same column are different. For example, in the light-emitting devices 3 in the same column, a light-emitting device 3 for emitting a first color light and a light-emitting device 3 for emitting a second color light are arranged periodically.

Optionally, the colors of the lights emitted by the light-emitting devices 3 in the same column are the same. For example, the light-emitting devices 3 in the same column all emit the third color light.

Of course, the arrangement of the light-emitting devices 3 is not limited thereto.

Figure 6:
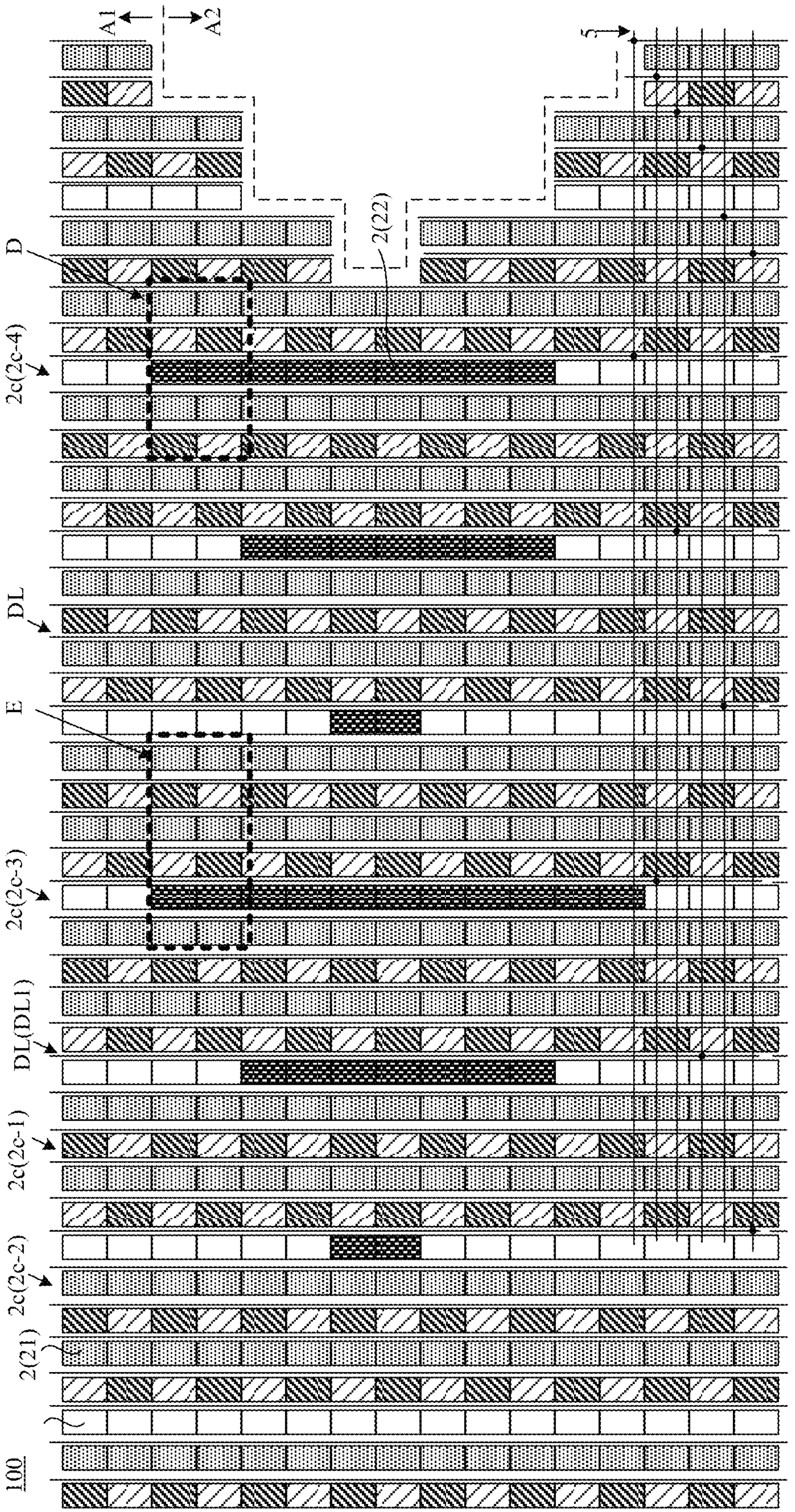
FIG. 6 is a structural diagram of another display substrate, in accordance with some embodiments.

As shown in FIG. 6, the plurality of pixel circuits 2 are arranged into a plurality of pixel circuit columns 2*c*. The plurality of pixel circuit columns 2*c* are sequentially arranged in the first direction X. Each pixel circuit column 2*c* includes multiple pixel circuits 2 sequentially arranged in the second direction Y. The first pixel circuit 2*a* electrically connected to the first light-emitting device 3*a* and the second pixel circuit 2*b* electrically connected to the second light-emitting device 3*b* are located in different pixel circuit columns 2*c*. FIG. 6 only illustrates an arrangement, and the arrangement of the pixel circuit columns 2*c* is not limited to the arrangement shown in FIG. 6.

For example, in combination with FIGS. 3 and 6, the first pixel circuits 2*a* electrically connected to all the first light-emitting devices 3*a* are arranged at least into a plurality of first pixel circuit columns 2*c*-1 and a plurality of second pixel circuit columns 2*c*-2. The second pixel circuits 2*b* electrically connected to all the second light-emitting devices 3*b* are arranged at least into a plurality of third pixel circuit columns 2*c*-3 and a plurality of fourth pixel circuit columns 2*c*-4. That is, the plurality of pixel circuit columns 2*c* at least include a plurality of first pixel circuit columns 2*c*-1, a plurality of second pixel circuit columns 2*c*-2, a plurality of third pixel circuit columns 2*c*-3 and a plurality of fourth pixel circuit columns 2*c*-4.

The first pixel circuit column 2*c*-1 is configured to drive the corresponding light-emitting devices 3 (i.e., the first light-emitting devices 3*a*) to emit the first color light and the second color light, and the second pixel circuit column 2*c*-2 is configured to drive the corresponding light-emitting devices 3 (i.e., the first light-emitting devices 3*a*) to emit the third color light. The third pixel circuit column 2*c*-3 is configured to drive the corresponding light-emitting devices 3 (i.e., the second light-emitting devices 3*b*) to emit the first color light and the second color light, and the fourth pixel circuit column 2*c*-4 is configured to drive the corresponding light-emitting devices 3 (i.e., the second light-emitting devices 3*b*) to emit the third color light. The first color light is, for example, red light, the second color light is, for example, blue light, and the third color light is, for example, green light.

Correspondingly, the arrangement of the plurality of light-emitting devices 3 is as follows: in the light-emitting devices 3 in the same row, a light-emitting device 3 for emitting a first color light, a light-emitting device 3 for emitting a third color light, a light-emitting device 3 for emitting a second color light and a light-emitting device 3 for emitting a third color light are arranged periodically. In at least two columns of light-emitting devices 3, the light-emitting devices 3 in the same column all emit the third color light. Moreover, in at least two columns of light-emitting devices 3, a light-emitting device 3 for emitting a first color light and a light-emitting device 3 for emitting a second color light are arranged alternately.

For example, the plurality of light-emitting devices 3 are arranged into a plurality of light-emitting device columns 3*c*. The plurality of light-emitting device columns 3*c* are sequentially arranged in the first direction X, and each light-emitting device column 3*c* includes multiple light-emitting devices 3 sequentially arranged in the second direction Y.

The embodiments of the present disclosure define multiple light-emitting devices 3, located in the same column, for emitting the first color light and the second color light as a first light-emitting device column, and define multiple light-emitting devices 3, located in the same column, for emitting the third color light as a second light-emitting device column. In the first direction X, the first light-emitting device columns and the second light-emitting device columns are alternately arranged.

Accordingly, the plurality of first pixel circuit columns 2*c*-1 and the plurality of second pixel circuit columns 2*c*-2 are alternately arranged in a row direction (i.e., the first direction X). At least one third pixel circuit column 2*c*-3 or at least one fourth pixel circuit column 2*c*-4 is located between a first pixel circuit column 2*c*-1 and a second pixel circuit column 2*c*-2 that are adjacent. The embodiments of the present disclosure are described by considering an example in which a third pixel circuit column 2c-3 is located between a first pixel circuit column 2c-1 and a second pixel circuit column 2c-2 that are adjacent, and a fourth pixel circuit column 2c-4 is located between a first pixel circuit column 2c-1 and a second pixel circuit column 2c-2 that are adjacent.

Optionally, at least one first pixel circuit column 2c-1 and/or at least one second pixel circuit column 2c-2 may be provided between two adjacent pixel circuit columns 2c (i.e., two adjacent third pixel circuit columns 2c-3, two adjacent fourth pixel circuit columns 2c-4, or a third pixel circuit column 2c-3 and a fourth pixel circuit column 2c-4 that are adjacent) for being electrically connected to the second light-emitting devices 3b.

Thus, it may be beneficial to reducing a misalignment quantity between the first light-emitting device 3a and the pixel circuit 2 electrically connected thereto.

For example, a first pixel circuit column 2c-1 or a second pixel circuit column 2c-2 is provided between two adjacent pixel circuit columns 2c for being electrically connected to the second light-emitting devices 3b.

As another example, a first pixel circuit column 2c-1 and a second pixel circuit column 2c-2 are provided between two adjacent pixel circuit columns 2c for being electrically connected to the second light-emitting devices 3b.

As another example, two first pixel circuit columns 2c-1 and two second pixel circuit columns 2c-2 are provided between two adjacent pixel circuit columns 2c for being electrically connected to the second light-emitting devices 3b.

As another example, three first pixel circuit columns 2c-1 and three second pixel circuit columns 2c-2 are provided between two adjacent pixel circuit columns 2c for being electrically connected to the second light-emitting devices 3b.

It can be understood that the division of the plurality of pixel circuit columns 2c is related to the arrangement of the light-emitting devices 3. This means that the plurality of pixel circuit columns 2c may further include a fifth pixel circuit column, a sixth pixel circuit column and the like depending on the specific arrangement, which is not limited in the embodiments of the present disclosure.

Figure 7:
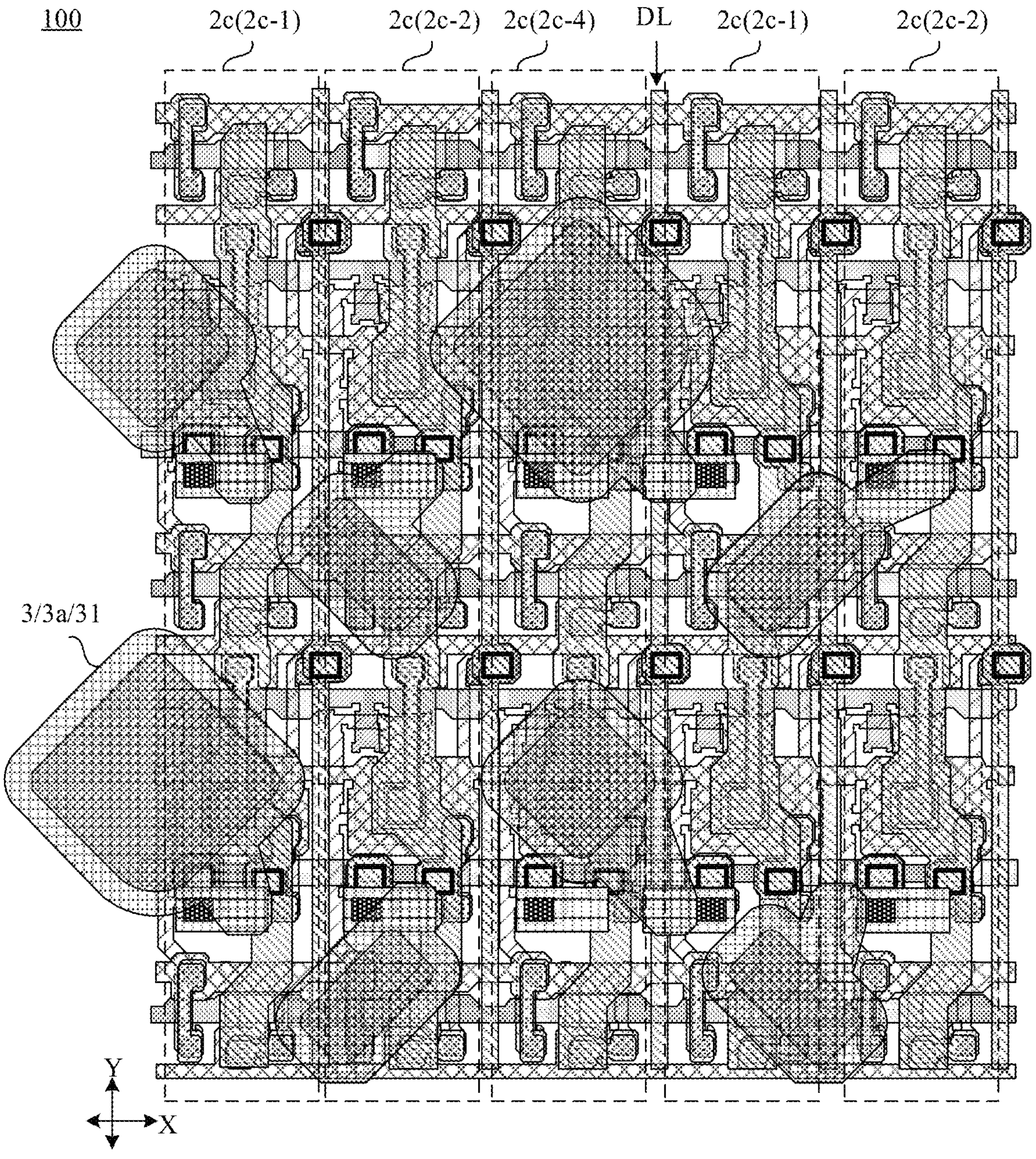
FIG. 7 is a structural diagram of yet another display substrate, in accordance with some embodiments.

In some examples, as shown in FIGS. 6 and 7, the display substrate 100 further includes a plurality of data lines DL. The plurality of data lines DL are located in the first display area A1 and are electrically connected to the plurality of pixel circuit columns 2c.

For example, the plurality of data lines DL and the plurality of pixel circuit columns 2c are electrically connected in one-to-one correspondence. The pixel circuit columns 2c and the data lines DL are arranged alternately in the first direction X. The pixel circuit shown in FIG. 7 is an enlarged structure of a region D of the pixel circuit in FIG. 6.

Different data lines DL may each be located on a left side of a pixel circuit column 2c electrically connected thereto, or may each be located on a right side of a pixel circuit column 2c electrically connected thereto. This is beneficial to improving the arrangement regularity of the pixel circuit columns 2c and the data lines DL.

During displaying an image by the display substrate 100, each data line DL may provide a data signal to data signal terminals Data of all pixel circuits 2 in the pixel circuit column 2c electrically connected to the data line DL.

Figure 8:
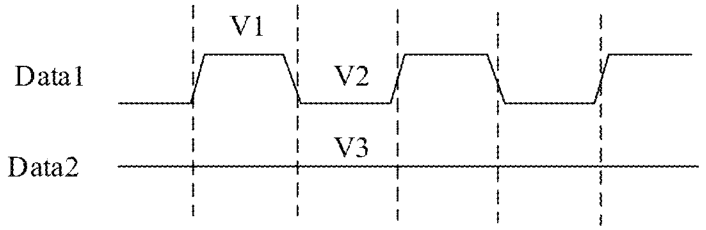
FIG. 8 is a timing diagram of a data signal, in accordance with some embodiments.

For example, in a case where the display substrate 100 displays a grayscale image, data signals transmitted by data lines DL electrically connected to the first pixel circuit column 2c-1 and the third pixel circuit column 2c-3 are shown as Data1 in FIG. 8; and data signals transmitted by data lines DL electrically connected to the second pixel circuit column 2c-2 and the fourth pixel circuit column 2c-4 are shown as Data2 in FIG. 8. Since there is a difference between the brightness of the first color light and the brightness of the second color light, a data voltage V1 required by a pixel circuit 2 corresponding to the first color light is different from a data voltage V2 required by a pixel circuit 2 corresponding to the second color light. Moreover, the first pixel circuit column 2c-1 and the third pixel circuit column 2c-3 may both drive the corresponding light-emitting devices 3 to emit the first color light and the second color light. Therefore, the voltage shown as Data1 jumps up and down, and the voltage shown as Data2 (i.e., V3) remains basically unchanged.

Here, for convenience of the following description, a data line DL electrically connected to the third pixel circuit column 2c-3 is defined as a first data line DL1. In combination with FIGS. 7 and 9, in FIG. 9 and the following related figures, some conductive layers (e.g., a first gate conductive layer, a second gate conductive layer and a first source-drain conductive layer) are omitted, and some patterns in a second source-drain conductive layer (also called a first conductive layer FL1) are used to represent each pixel circuit column 2c. As for the first conductive layer FL1, reference may be made to the following description, and details are not provided here. The pixel circuit shown in FIG. 9 is an enlarged structure of a region E of the pixel circuit in FIG. 6.

Figure 9:
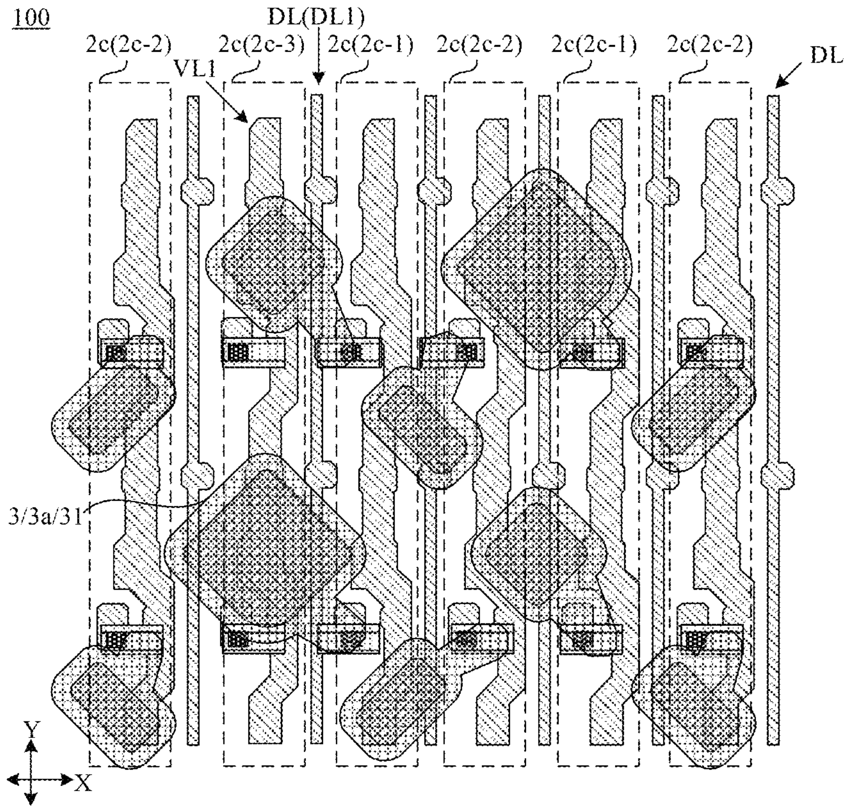
FIG. 9 is a structural diagram of yet another display substrate, in accordance with some embodiments.

In an implementation, as shown in FIGS. 6 and 9, the first data line DL1 is located on a side of the third pixel circuit column 2c-3 proximate to the first pixel circuit column 2c-1. The arrangement positions of other data lines may be similar to the arrangement positions of the first data lines DL1.

Figure 10:
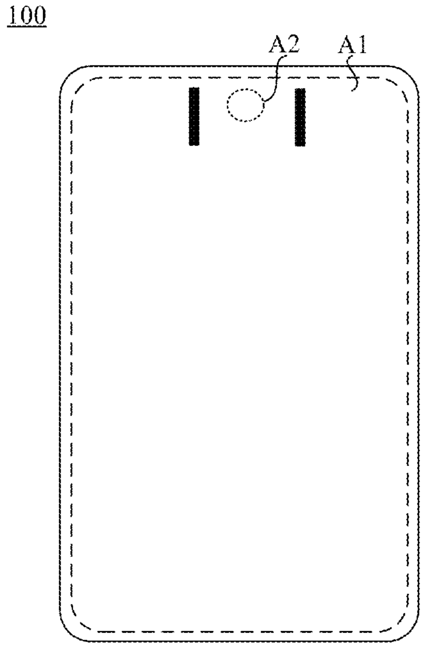
FIG. 10 is a structural diagram of yet another display substrate, in accordance with some embodiments.

It has been verified by the inventors of the present disclosure that parasitic capacitances may be generated between the first data line DL1 and the first pixel circuit column 2c-1 adjacent thereto, and the parasitic capacitances include: in the pixel circuit 2 located in the first pixel circuit column 2c-1, a parasitic capacitance between the first node N1 and the first data line DL1 and a parasitic capacitance between the fourth node N4 and the first data line DL1 (which may also be understood as a parasitic capacitance between the anode of the first light-emitting device 3a electrically connected to the first pixel circuit column 2c-1 and the first data line DL1). In this way, when the voltage of the data signal transmitted by the first data line DL1 jumps up and down, a potential at the first node N1 that generates a parasitic capacitance with the first data line DL1 will change, thereby causing the driving signal generated by the pixel circuit 2 to which the first node N1 belongs to change, and causing the brightness of the light emitted by the first light-emitting device 3a electrically connected to the pixel circuit 2 to be different. Moreover, a potential at the fourth node N4 that generates a parasitic capacitance with the first data line DL1 will also change, thereby further affecting the brightness of the light emitted by the first light-emitting device 3a. As a result, the display substrate 100 may be caused to produce display abnormality (e.g., bar defects shown in FIG. 10).

In addition, the inventors of the present disclosure have found that the above display abnormality phenomenon basically occurs at the position of the first pixel circuit column 2c-1 adjacent to the first data line DL1, and the above bar defects basically do not occur at other positions.

Figure 11:
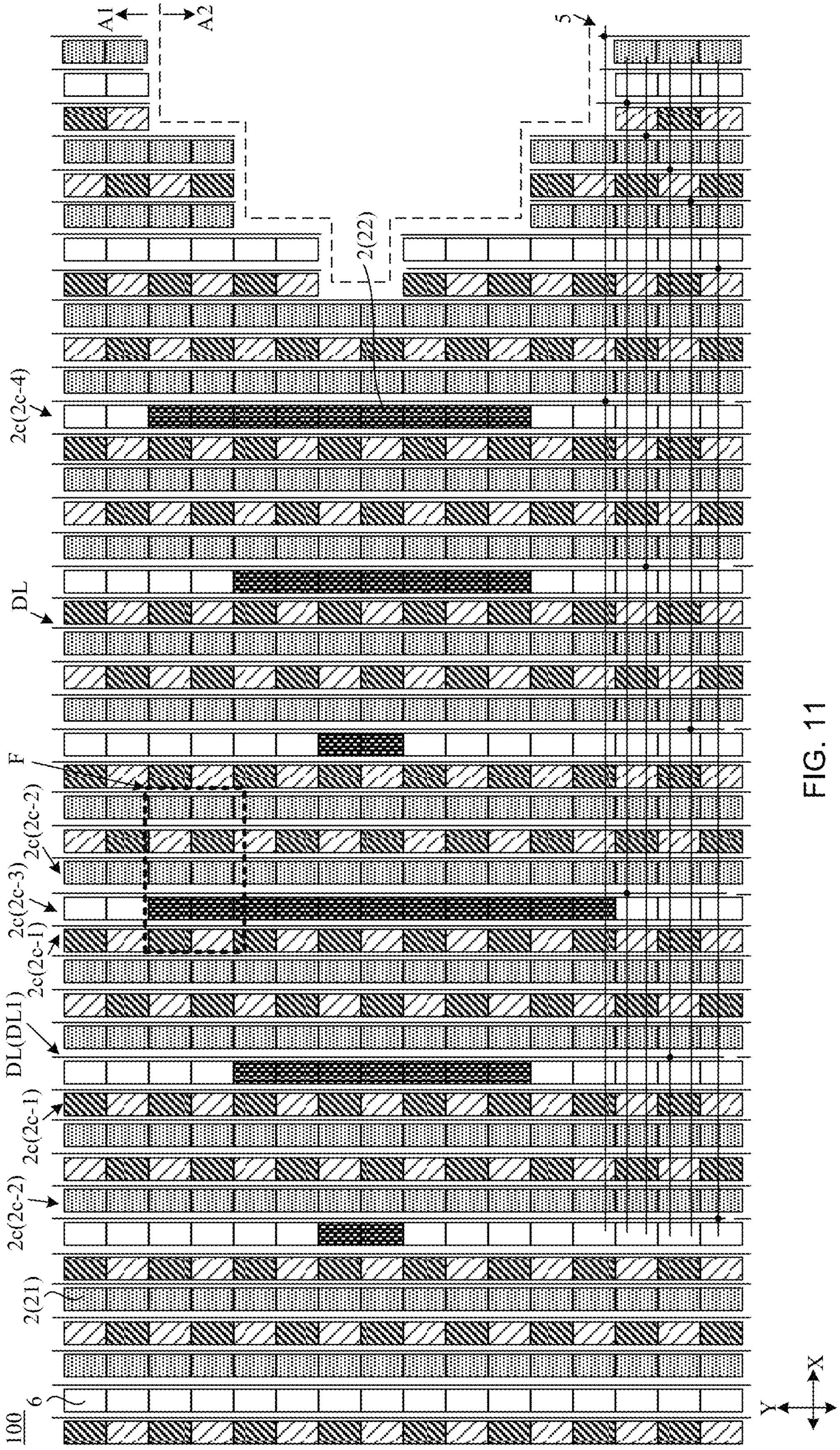
FIG. 11 is a structural diagram of yet another display substrate, in accordance with some embodiments.
Figure 12:
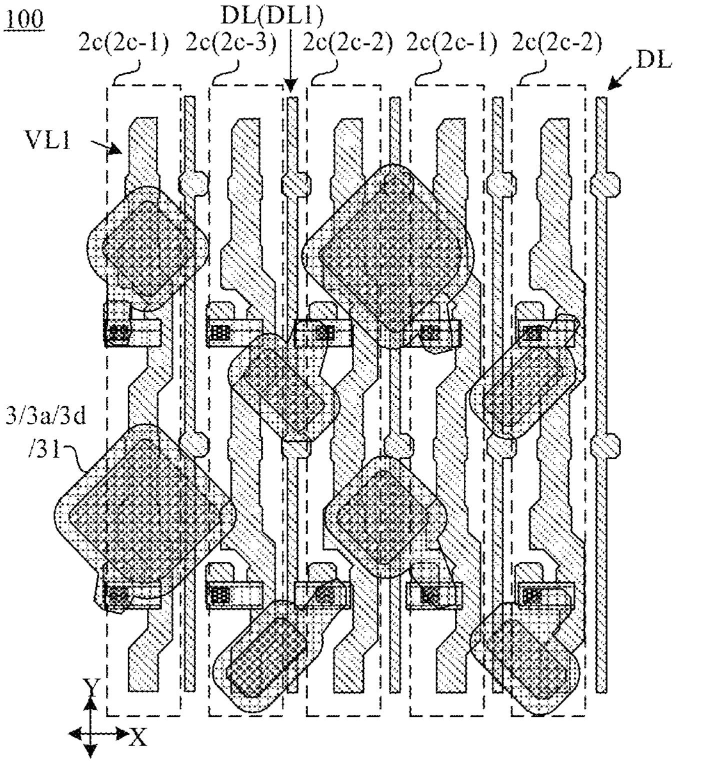
FIG. 12 is a structural diagram of yet another display substrate, in accordance with some embodiments.

In light of this, as shown in FIGS. 11 and 12, some embodiments of the present disclosure provide a display substrate 100. In the display substrate 100, a first data line DL1 is located between a third pixel circuit column 2*c*-3 electrically connected to the first data line DL1 and a second pixel circuit column 2*c*-2 adjacent to the third pixel circuit column 2*c*-3. In this case, between the first data line DL1 and an adjacent first pixel circuit column 2*c*-1, the third pixel circuit column 2*c*-3 and a data line DL connected to the first pixel circuit column 2*c*-1 are provided at intervals. FIG. 11 only illustrates an arrangement, and the arrangement of the pixel circuit column 2*c* is not limited to the arrangement shown in FIG. 11. The pixel circuit shown in FIG. 12 is an enlarged structure of a region F of the pixel circuit in FIG. 11.

In this way, a distance between the first data line DL1 and the first pixel circuit column 2*c*-1 adjacent thereto may effectively increase, that is, a distance between the first data line DL1 and both the first node N1 and the fourth node N4 in the pixel circuit 2 located in the above first pixel circuit column 2*c*-1 may increase, thereby effectively reducing the parasitic capacitance between the first data line DL1 and both the first node N1 and the fourth node N4 in the pixel circuit 2 in the first pixel circuit column 2*c*-1 adjacent to the first data line DL1.

The inventors of the present disclosure have detected the parasitic capacitance between the first data line DL1 and the first pixel circuit column 2*c*-1 adjacent thereto, and the detection results are shown in Table 1 below.

TABLE 1

| / | N1-1 | N1-2 | N4-1 | N4-2 |
|---|---|---|---|---|
| ① | 31.61 aF | 31.51 aF | 1.60 fF | 1.90 fF |
| ② | 1.44 aF | 1.69 aF | 0.3 fF | 0.69 fF |

In the above Table 1, the solution represented by the serial number ① is as follows: in the above implementation, the first data line DL1 is located on a side of the third pixel circuit column 2*c*-3 proximate to the first pixel circuit column 2*c*-1. The solution represented by the serial number ② is as follows: in some embodiments of the present disclosure, the first data line DL1 is located between the third pixel circuit column 2*c*-3 and the second pixel circuit column 2*c*-2. N1-1 represents a parasitic capacitance between a first node N1 in a pixel circuit 2 electrically connected to a first light-emitting device 3*a* for emitting the first color light (e.g., red light) in a first pixel circuit column 2*c*-1 and a first data line DL1. N1-2 represents a parasitic capacitance between a first node N1 in a pixel circuit 2 electrically connected to a first light-emitting device 3*a* for emitting the second color light (e.g., blue light) in a first pixel circuit column 2*c*-1 and a first data line DL1. N4-1 represents a parasitic capacitance between a fourth node N4 in a pixel circuit 2 electrically connected to a first light-emitting device 3*a* for emitting the first color light (e.g., red light) in a first pixel circuit column 2*c*-1 and a first data line DL1. N4-2 represents a parasitic capacitance between a fourth node N4 in a pixel circuit 2 electrically connected to a first light-emitting device 3*a* for emitting the second color light (e.g., blue light) in a first pixel circuit column 2*c*-1 and a first data line DL1.

It can be seen from Table 1 that compared with the above implementation, in some embodiments of the present disclosure, the parasitic capacitance between the first data line DL1 and the first pixel circuit column 2*c*-1 adjacent thereto is greatly reduced. The parasitic capacitance between the first data line DL1 and the first node N1 in the pixel circuit 2 in the first pixel circuit column 2*c*-1 adjacent to the first data line DL1 is reduced to below 2 aF; and the parasitic capacitance between the first data line DL1 and the fourth node N4 in the pixel circuit 2 in the first pixel circuit column 2*c*-1 adjacent to the first data line DL1 is reduced to below 1 fF.

Therefore, in the display substrate 100 provided by some embodiments of the present disclosure, the first data line DL1 is disposed between the third pixel circuit column 2*c*-3 electrically connected to the first data line DL1 and the second pixel circuit column 2*c*-2 adjacent to the third pixel circuit column 2*c*-3. Thus, the distance between the first data line DL1 and the first pixel circuit column 2*c*-1 adjacent thereto may effectively increase, the parasitic capacitance between the first data line DL1 and the first pixel circuit column 2*c*-1 adjacent thereto may be effectively reduced, thereby reducing an influence of the data signal transmitted by the first data line DL1 on the potentials at the first node N1 and the fourth node N4 in the pixel circuit 2 in the first pixel circuit column 2*c*-1 adjacent to the first data line DL1. As a result, the accuracy of the driving signal generated by the pixel circuit 2 in the first pixel circuit column 2*c*-1 adjacent to the first data line DL1 may be improved, and the brightness difference of the light emitted by the first light-emitting device 3*a* electrically connected to the pixel circuit 2 may be reduced, thereby improving or even eliminating the bar defects of the display substrate 100, and improving the display effect of the display substrate 100.

It can be understood that there are a variety of ways to provide the first data line DL1 between the third pixel circuit column 2*c*-3 electrically connected to the first data line DL1 and the second pixel circuit column 2*c*-2 adjacent to the third pixel circuit column 2*c*-3, and are not limited to the following examples.

In some examples, the positions of the first data line DL1, the third pixel circuit column 2*c*-3 electrically connected to the first data line DL1, the first pixel circuit column 2*c*-1 adjacent to the first data line DL1 and the data line DL electrically connected to the first pixel circuit column 2*c*-1 are changed. In this way, on a basis of improving the display effect of the display substrate 100, layout changes and design difficulties of the display substrate 100 may be reduced.

It can be understood that after the positions of the first data line DL1, the third pixel circuit column 2*c*-3 electrically connected to the first data line DL1, the first pixel circuit column 2*c*-1 adjacent to the first data line DL1 and the data line DL electrically connected to the first pixel circuit column 2*c*-1 are changed, morphologies and sizes of the first light-emitting device 3*a* electrically connected to the first pixel circuit column 2*c*-1 may be adaptively adjusted.

The above arrangement will be schematically described below with reference to the accompanying drawings.

Optionally, two first pixel circuit columns 2*c*-1 and two second pixel circuit columns 2*c*-2 are provided between two adjacent pixel circuit columns 2*c* for being electrically connected to the second light-emitting devices 3*b*.

FIG. 9 shows six pixel circuit columns 2*c*, i.e., a second pixel circuit column 2*c*-2, a third pixel circuit column 2*c*-3, a first pixel circuit column 2*c*-1, a second pixel circuit column 2*c*-2, a first pixel circuit column 2*c*-1 and a second pixel circuit column 2*c*-2 that are arranged sequentially in the first direction X.

For example, FIG. 12 shows a structure after the positions of the third pixel circuit column 2*c*-3, the first data line DL1 electrically connected to the third pixel circuit column 2c-3, the first pixel circuit column 2c-1 adjacent to the first data line DL1, and the data line DL electrically connected to the first pixel circuit column 2c-1 are changed. In FIG. 12, the first pixel circuit column 2c-1, the third pixel circuit column 2c-3, the second pixel circuit column 2c-2, the first pixel circuit column 2c-1 and the second pixel circuit column 2c-2 are arranged in sequence in the first direction X.

Figure 13:
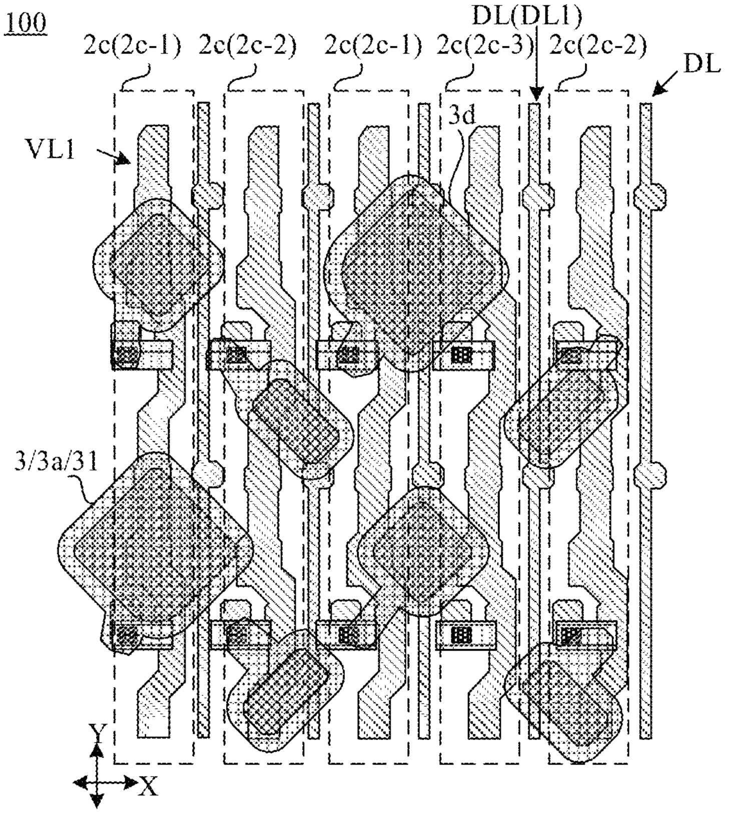
FIG. 13 is a structural diagram of yet another display substrate, in accordance with some embodiments.

Of course, the embodiments of the present disclosure may alternatively change the positions of the third pixel circuit column 2c-3, the first data line DL1 electrically connected to the third pixel circuit column 2c-3, another first pixel circuit column 2c-1 and the data line DL electrically connected to the first pixel circuit column 2c-1. FIG. 13 schematically shows a structure after the positions of the third pixel circuit column 2c-3, the first data line DL1 electrically connected to the third pixel circuit column 2c-3, the first pixel circuit column 2c-1 adjacent to the first data line DL1, and the data line DL electrically connected to the first pixel circuit column 2c-1 are changed. In FIG. 13, the first pixel circuit column 2c-1, the second pixel circuit column 2c-2, the first pixel circuit column 2c-1, the third pixel circuit column 2c-3 and the second pixel circuit column 2c-2 are arranged in sequence in the first direction X.

Figure 14:
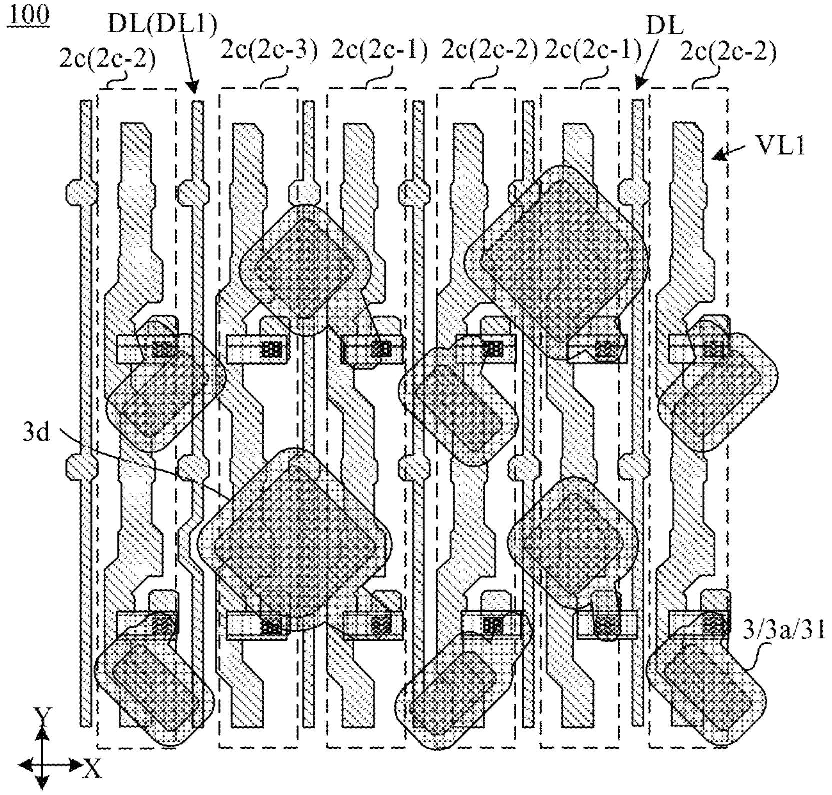
FIG. 14 is a structural diagram of yet another display substrate, in accordance with some embodiments.
Figure 15:
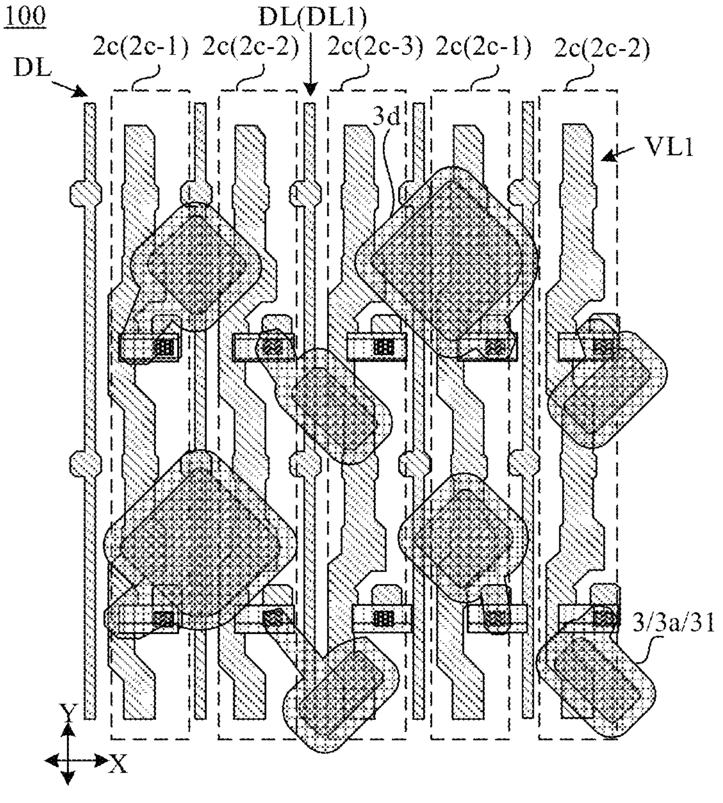
FIG. 15 is a structural diagram of yet another display substrate, in accordance with some embodiments.

It can be understood that FIGS. 12 and 13 show examples where different data lines DL are all located on right sides of the pixel circuit columns 2c electrically connected thereto. In addition, FIGS. 14 and 15 show examples where different data lines DL are all located on left sides of the pixel circuit columns 2c electrically connected thereto. In FIG. 14, the second pixel circuit column 2c-2, the third pixel circuit column 2c-3, the first pixel circuit column 2c-1, the second pixel circuit column 2c-2, the first pixel circuit column 2c-1 and the second pixel circuit column 2c-2 that are arranged sequentially in the first direction X. In FIG. 15, the first pixel circuit column 2c-1, the second pixel circuit column 2c-2, the third pixel circuit column 2c-3, the first pixel circuit column 2c-1 and the second pixel circuit column 2c-2 that are arranged sequentially in the first direction X.

Optionally, a first pixel circuit column 2c-1 and a second pixel circuit column 2c-2 are provided between two adjacent pixel circuit columns 2c for being electrically connected to the second light-emitting devices 3b.

Figure 16:
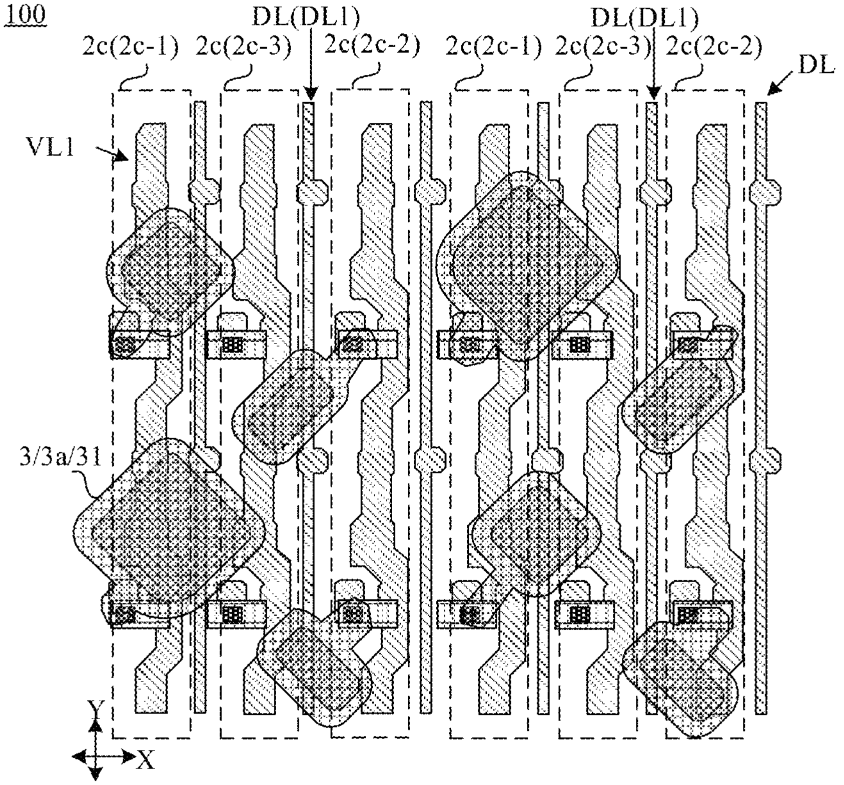
FIG. 16 is a structural diagram of yet another display substrate, in accordance with some embodiments.

FIG. 16 shows six pixel circuit columns 2c, i.e., a first pixel circuit column 2c-1, a third pixel circuit column 2c-3, a second pixel circuit column 2c-2, a first pixel circuit column 2c-1, a third pixel circuit column 2c-3 and a second pixel circuit column 2c-2 that are arranged sequentially in the first direction X. The different data lines DL are all located on right sides of the pixel circuit columns 2c electrically connected thereto.

It can be understood that a positional relationship between first light-emitting devices 3a connected to the first pixel circuit column 2c-1 adjacent to the third pixel circuit column 2c-3 and the first data line DL1 varies, and may be provided depending on actual needs. Here, a first light-emitting device 3a electrically connected to the first pixel circuit column 2c-1 adjacent to the third pixel circuit column 2c-3 is defined as a target light-emitting device 3d.

In some embodiments, as shown in FIGS. 12 to 15, an orthographic projection of the first data line DL1 on a plane where the display substrate 100 is located has no overlap with an orthographic projection of the target light-emitting device 3d on the plane where the display substrate 100 is located. The plane where the display substrate 100 is located is parallel to the substrate 1. That is, in a direction perpendicular to the substrate 1, the first data line DL1 and the target light-emitting device 3d are staggered from each other and have no overlap portion.

The light-emitting device 3 includes an anode 31. The orthographic projection of the first data line DL1 on the plane where the display substrate 100 is located having no overlap with the orthographic projection of the target light-emitting device 3d on the plane where the display substrate 100 is located refers to, for example, that the orthographic projection of the first data line DL1 on the plane where the display substrate 100 is located has no overlap with an orthographic projection of an anode 31 of the target light-emitting device 3d on the plane where the display substrate 100 is located.

In this way, a parasitic capacitance between the first data line DL1 and the anode 31 of the target light-emitting device 3d may further be reduced, that is, the parasitic capacitance between the first data line DL1 and the fourth node N4 in the pixel circuit 2 in the first pixel circuit column 2c-1 adjacent thereto may further be reduced, so as to further reduce an influence of the data signal transmitted by the first data line DL1 on the potential at the fourth node N4 in the pixel circuit 2 in the first pixel circuit column 2c-1 adjacent to the first data line DL1, thereby improving or even eliminating the bar defects of the display substrate 100, and improving the display effect of the display substrate 100.

In this case, the arrangement between the target light-emitting device 3d and the first data line DL1 may vary, and may be provided according to actual needs.

For example, as shown in FIGS. 12 and 13, a portion of the first data line DL1 adjacent to the target light-emitting device 3d is in a shape of a straight line. Here, the portion of the first data line DL1 adjacent to the target light-emitting device 3d refers to a portion of the first data line DL1 having an orthographic projection on a plane perpendicular to the first direction X overlapped with an orthographic projection of the anode 31 of the target light-emitting device 3d on the plane perpendicular to the first direction X.

That is, during wiring, the first data line DL1 is provided proximate to the third pixel circuit column 2c-3 electrically connected thereto, and there is enough space for providing the target light-emitting device 3d.

In this way, the regularity of the morphology of the first data line DL1 may be improved, and the difficulty in forming the first data line DL1 may be reduced.

For example, as shown in FIG. 14, a portion of the first data line DL1 adjacent to the target light-emitting device 3d wraps around at least a portion of an edge of the target light-emitting device 3d. That is, along a path where the first data line DL1 extends, the portion of the first data line DL1 adjacent to the target light-emitting device 3d bypasses at least the portion of the edge of the target light-emitting device 3d.

For example, the morphology of the portion of the first data line DL1 adjacent to the target light-emitting device 3d is the same as or similar to the morphology of the portion of the edge of the light-emitting device 3d proximate to the first data line DL1. In a direction perpendicular to the plane where the display substrate 100 is located, there is a distance between the portion of the first data line DL1 adjacent to the target light-emitting device 3d and the portion of the edge of the light-emitting device 3d proximate to the first data line DL1, and the distance at different positions may be equal or approximately equal.

In the structure shown in FIG. 14, in the first direction X, the first data line DL1 is located on a left side of the target light-emitting device 3d, and the portion of the edge of the target light-emitting device 3*d* located on the left side protrudes towards left. Accordingly, a portion of the first data line DL1 adjacent to the target light-emitting device 3*d* protrudes towards left. Of course, in a case where the first data line DL1 is located on a right side of the target light-emitting device 3*d*, and the portion of the edge of the target light-emitting device 3*d* located on the right side protrudes towards right, a portion of the first data line DL1 adjacent to the target light-emitting device 3*d* protrudes towards right. That is, during wiring, the first data line DL1 may bypass the target light-emitting device 3*d* by winding.

In this way, the target light-emitting device 3*d* may be avoided, thereby reducing the parasitic capacitance between the first data line DL1 and the anode 31 of the target light-emitting device 3*d*, and even avoiding formation of the parasitic capacitance between the first data line DL1 and the anode 31 of the target light-emitting device 3*d*.

Figure 17:
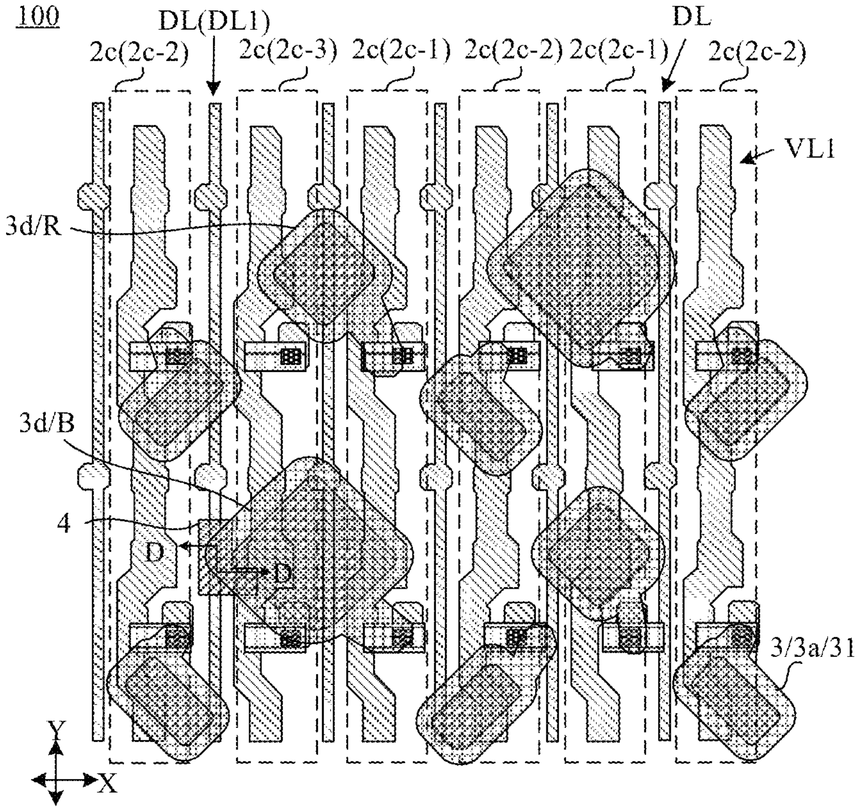
FIG. 17 is a structural diagram of yet another display substrate, in accordance with some embodiments.

In some other embodiments, as shown in FIG. 17, an orthographic projection of the first data line DL1 on a plane where the display substrate 100 is located and an orthographic projection of at least one target light-emitting device 3*d* on the plane where the display substrate 100 is located overlap partially. That is, in a direction perpendicular to the substrate 1, the first data line DL1 and the target light-emitting device 3*d* have an overlap portion.

The orthographic projection of the first data line DL1 on the plane where the display substrate 100 is located and the orthographic projection of the target light-emitting device 3*d* on the plane where the display substrate 100 is located overlap partially, which includes but is not limited to, the orthographic projection of the first data line DL1 on the plane where the display substrate 100 is located and an orthographic projection of an anode 31 of the target light-emitting device 3*d* on the plane where the display substrate 100 is located overlap partially.

Further, as shown in FIG. 17, the display substrate 100 further includes a shielding pattern 4 located between the first data line DL1 and the target light-emitting device 3*d* in a direction perpendicular to the plane where the display substrate 100 is located.

For example, the material of the shielding pattern 4 is a conductive material, and the conductive material includes but is not limited to a metal material. An insulating layer (also referred to as a planarization layer) is provided between the shielding pattern 4 and the first data line DL1, and an insulating layer (also referred to as a planarization layer) is provided between the shielding pattern 4 and the target light-emitting device 3*d*.

The shielding pattern 4 is configured to receive a constant voltage electrical signal. That is, the shielding pattern 4 has an electric signal with a constant voltage. The constant voltage electrical signal received by the shielding pattern 4 includes but is not limited to a first voltage signal, a first initial signal, a second initial signal, or the like.

In this way, the shielding pattern 4 may be used to shield the target light-emitting device 3*d*, so as to reduce or even shield an influence of the data signal transmitted by the first data line DL1 on the anode 31 of the target light-emitting device 3*d*, that is, to reduce or even shield the influence of the data signal transmitted by the first data line DL1 on the potential at the fourth node N4 in the pixel circuit 2 in the first pixel circuit column 2*c*-1 adjacent to the first data line DL1, thereby improving the stability of the potential at the fourth node N4, improving or even eliminating the bar defects of the display substrate 100, and improving the display effect of the display substrate 100.

Figure 18:
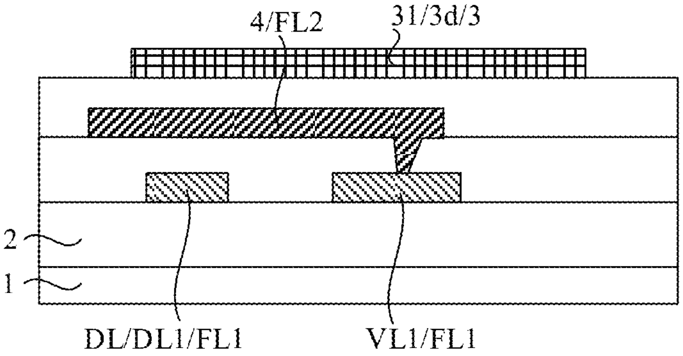
FIG. 18 is a sectional view of the display substrate shown in FIG. 17 taken along a D-D direction.

In some examples, as shown in FIG. 18, orthographic projections of the shielding pattern 4, the target light-emitting device 3*d* and the first data line DL1 on the plane where the display substrate 100 is located overlap partially. FIG. 18 uses the anode 31 of the target light-emitting device 3*d* to represent the target light-emitting device 3*d*.

That is, in a direction perpendicular to the substrate 1, the first data line DL1, the shielding pattern 4 and the target light-emitting device 3*d* have overlap portions. An area of the overlap portions of the three is related to the actual wiring situation, and is not limited in the present disclosure.

In this way, it may ensure the shielding pattern 4 to separate overlap portions of the target light-emitting device 3*d* and the first data line DL1, ensure a good shielding effect of the shielding pattern 4 on the target light-emitting device 3*d*, and thus effectively reduce or even shield the influence of the data signal transmitted by the first data line DL1 on the anode 31 of the target light-emitting device 3*d*, and effectively improve the stability of the potential at the fourth node N4.

In some examples, the first color light is red light, the second color light is blue light, and the third color light is green light. A target light-emitting device 3*d* for emitting red light constitutes a red target light-emitting device R, and a target light-emitting device 3*d* for emitting blue light constitutes a blue target light-emitting device B. An area of the red target light-emitting device R is less than that of the blue target light-emitting device B.

As shown in FIG. 17, in a direction perpendicular to the plane where the display substrate 100 is located, the shielding pattern 4 is located between the blue target light-emitting device B and the first data line DL1. The orthographic projections of the shielding pattern 4, the blue target light-emitting device B and the first data line DL1 on the plane where the display substrate 100 is located overlap partially.

That is, the blue target light-emitting device B has a relatively large area, so that the blue target light-emitting device B may extend above the first data line DL1, and thus the orthographic projections of the blue target light-emitting device B and the first data line DL1 on the plane where the display substrate 100 is located overlap partially. The red target light-emitting device R has a relatively small area, so that there is a distance between an orthographic projection of the red target light-emitting device R on the plane where the display substrate 100 is located and an orthographic projection of the first data line DL1 on the plane where the display substrate 100 is located.

There are, for example, a plurality of shielding patterns 4, and the plurality of shielding patterns 4 and the target light-emitting devices 3*d* may be provided in one-to-one correspondence.

For example, the plurality of shielding patterns 4 are disposed in the same layer.

The "same layer" mentioned herein refers to that a film layer for forming specific patterns is formed by using a same film-forming process, and then a patterning process is performed on the film layer by using a same mask to form a layer structure. Depending on different specific patterns, the patterning process may include several exposure, development and etching processes. The specific patterns in the formed layer structure may be continuous or discontinuous, and these specific patterns may also be at different heights or have different thicknesses. In this way, the plurality of shielding patterns 4 may be formed simultaneously, which is helpful to reduce the difficulty in forming the display substrate 100.

For example, in the plurality of shielding patterns 4, at least two shielding patterns 4 are connected to form an integrated structure. The at least two shielding patterns 4 are, for example, at least two shielding patterns 4 adjacent to each other in the first direction X, or at least two shielding patterns 4 adjacent to each other in the second direction Y. Of course, the at least two shielding patterns 4 may also include at least two shielding patterns 4 adjacent to each other in the first direction X and at least two shielding patterns 4 adjacent to each other in the second direction Y.

Figure 19:
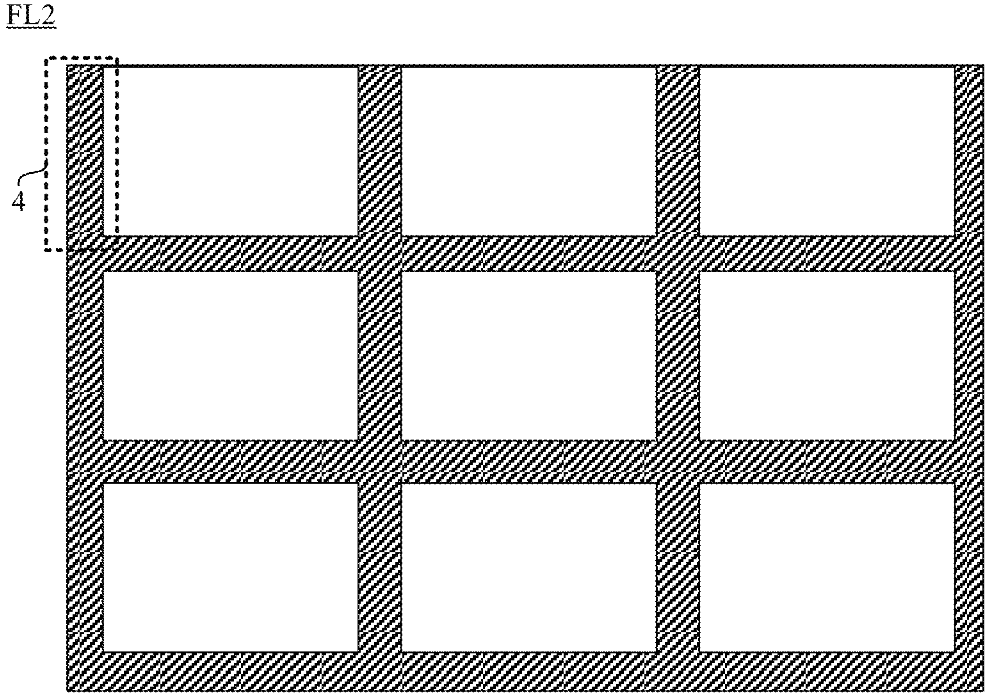
FIG. 19 a structural diagram of a second conductive layer, in accordance with some embodiments.

For example, the plurality of shielding patterns 4 included in the display substrate 100 are of an integrated structure. In this case, as shown in FIG. 19, the plurality of shielding patterns 4 are in a grid shape.

Here, the "integrated structure" means that at least two connected shielding patterns 4 are continuous and not separated. In this way, the size of the at least two shielding patterns 4 in an integrated structure may increase, thereby reducing the difficulty in etching a film layer where the shielding patterns 4 are located.

In some examples, as shown in FIG. 18, the display substrate 100 includes a first conductive layer FL1 and a second conductive layer FL2. In a direction perpendicular to the substrate 1, the first conductive layer FL1 is located between the plurality of pixel circuits 2 and the plurality of light-emitting devices 3, and the second conductive layer FL2 is located between the first conductive layer FL1 and the plurality of light-emitting devices 3.

The display substrate 100 further includes a plurality of first voltage signal lines VL1, and the plurality of first voltage signal lines VL1 are respectively electrically connected to the plurality of pixel circuit columns 2*c*. For example, the plurality of first voltage signal lines VL1 and the plurality of pixel circuit columns 2*c* are disposed in one-to-one correspondence, and a first voltage signal line VL1 is electrically connected to first voltage signal terminals VDD of each pixel circuit 2 in the corresponding pixel circuit column 2*c*.

For example, the first conductive layer FL1 includes the plurality of data lines DL and the plurality of first voltage signal lines VL1.

Providing the data lines DL and the first voltage signal lines VL1 in the first conductive layer FL1 may be beneficial to increasing a wiring space.

The second conductive layer FL2 includes the shielding patterns 4. For example, the plurality of shielding patterns 4 are all located in the second conductive layer FL2. The shielding pattern 4 is electrically connected to the first voltage signal line VL1 to receive the first voltage signal.

For example, the first voltage signal line VL1 electrically connected to the shielding pattern 4 is, for example, the first voltage signal line VL1 electrically connected to the third pixel circuit column 2*c*-3. Multiple shielding patterns 4 located in the same column are, for example, electrically connected to the same first voltage signal line VL1.

Providing the second conductive layer FL2 between the first conductive layer FL1 and the light-emitting devices 3, and providing the shielding patterns 4 in the second conductive layer FL2 may be beneficial to increasing the wiring space and reducing the wiring difficulty.

Of course, in a case where the data lines DL and the first voltage signal lines VL1 are located in different layers, the shielding patterns 4 and the first voltage signal lines VL1 may be provided in the same layer.

In some embodiments, in combination with FIGS. 3 and 11, in the plurality of light-emitting device columns 3*c* into which the plurality of light-emitting devices 3 in the display substrate 100 are arranged, at least one light-emitting device column 3*c* includes multiple first light-emitting devices 3*a* located in the first display area A1 and multiple second light-emitting devices 3*b* located in the second display area A2.

A data line DL electrically connected to a pixel circuit column 2*c* electrically connected to the multiple first light-emitting devices 3*a* in each light-emitting device column 3*c* in the above at least one light-emitting device column 3*c* is connected to a data line DL electrically connected to a pixel circuit column 2*c* electrically connected to the multiple second light-emitting devices 3*b* in the light-emitting device column 3*c*. The data line DL electrically connected to the pixel circuit column 2*c* electrically connected to the multiple second light-emitting devices 3*b* in the light-emitting device column 3*c* is the first data line DL1.

For example, as shown in FIG. 11, the display substrate 100 further includes a plurality of transfer lines 5. The transfer line 5 extends in the first direction X and is connected to the data line DL electrically connected to the pixel circuit column 2*c* electrically connected to the multiple first light-emitting devices 3*a* in each light-emitting device column 3*c* and the data line DL electrically connected to the pixel circuit column 2*c* electrically connected to the multiple second light-emitting devices 3*b* in the light-emitting device column 3*c*. That is, in the second direction Y, a data line DL, located on a lower side of the second display area A2, electrically connected to a pixel circuit column 2*c* electrically connected to the first light-emitting devices 3*a* is connected to a data line DL, located on a left or right side of the second display area A2, electrically connected to a pixel circuit column 2*c* electrically connected to second light-emitting device 3*b*.

In this way, in the same light-emitting device column 3*c*, the pixel circuit column 2*c* electrically connected to the multiple first light-emitting devices 3*a* and the pixel circuit column 2*c* electrically connected to the second light-emitting devices 3*b* may receive the same data signal, so as to facilitate control of the emission states of all the light-emitting devices 3 located in the same light-emitting device column 3*c*.

In some embodiments, as shown in FIGS. 12 to 17, an orthographic projection of the first light-emitting device 3*a* electrically connected to the second pixel circuit column 2*c*-2 adjacent to the third pixel circuit column 2*c*-3 on a plane where the display substrate 100 is located and an orthographic projection of the first data line DL1 on the plane where the display substrate 100 is located overlap partially.

This facilitates achieving the uniform arrangement of different light-emitting devices 3.

In some embodiments, as shown in FIG. 11, at least one third pixel circuit column 2*c*-3 and at least one fourth pixel circuit column 2*c*-4 are disposed on a side of the second display area A2 in the row direction (i.e., the first direction X).

For example, the plurality of third pixel circuit columns 2*c*-3 and the plurality of fourth pixel circuit columns 2*c*-4 included in the display substrate 100 may all be located on the same side (e.g., the left side or the right side) of the second display area A2 in the row direction. Of course, in the plurality of third pixel circuit columns 2*c*-3, some third pixel circuit columns 2*c*-3 may be located on a side of two opposite sides of the second display area A2 in the row direction, and the other third pixel circuit columns 2*c*-3 may be located on the other side of two opposite sides of the second display area A2 in the row direction. In the plurality of fourth pixel circuit columns 2c-4, some fourth pixel circuit columns 2c-4 may be located on a side of two opposite sides of the second display area A2 in the row direction, and the other fourth pixel circuit columns 2c-4 may be located on the other side of two opposite sides of the second display area A2 in the row direction.

This is beneficial to improving the arrangement regularity of the pixel circuits 2, so as to facilitate an electrical connection between the third pixel circuit column 2c-3 and the corresponding second light-emitting devices 3b and facilitate an electrical connection between the fourth pixel circuit column 2c-4 and the corresponding second light-emitting devices 3b.

In some examples, as shown in FIG. 11, in the third pixel circuit column 2c-3 and the fourth pixel circuit column 2c-4 that are located on the same side of the second display area A2, the fourth pixel circuit column 2c-4 is closer to the second display area A2 than the third pixel circuit column 2c-3.

That is to say, in the third pixel circuit column 2c-3 and the fourth pixel circuit column 2c-4 that are located on the same side of the second display area A2, each fourth pixel circuit column 2c-4 is located between the third pixel circuit column 2c-3 closest to the second display area A2 and the second display area A2, and each third pixel circuit column 2c-3 is located on a side of the fourth pixel circuit column 2c-4 away from the second display area A2.

For example, FIG. 11 shows three third pixel circuit columns 2c-3 and three fourth pixel circuit columns 2c-4 that are located on the left side of the second display area A2. The three third pixel circuit columns 2c-3 are located on a side of the three fourth pixel circuit columns 2c-4 away from the second display area A2, and the three fourth pixel circuit columns 2c-4 are located between the three third pixel circuit columns 2c-3 and the second display area A2.

This is beneficial to improving a low grayscale lighting level of the second display area A2.

In some embodiments, as shown in FIG. 11, the display substrate 100 further includes a plurality of dummy pixel circuits 6. Some of the dummy pixel circuits 6 and the third pixel circuit column 2c-3 are located in the same column, and some of the dummy pixel circuits 6 and the fourth pixel circuit column 2c-4 are located in the same column.

The structure of the dummy pixel circuit 6 is the same as the structure of the pixel circuit 2. However, the dummy pixel circuit 6 is not used to generate a driving signal and is not electrically connected to the light-emitting device 3. A data signal line electrically connected to the dummy pixel circuit 6 may be floating or may receive a constant voltage electrical signal (e.g., the first voltage signal).

Figure 20:
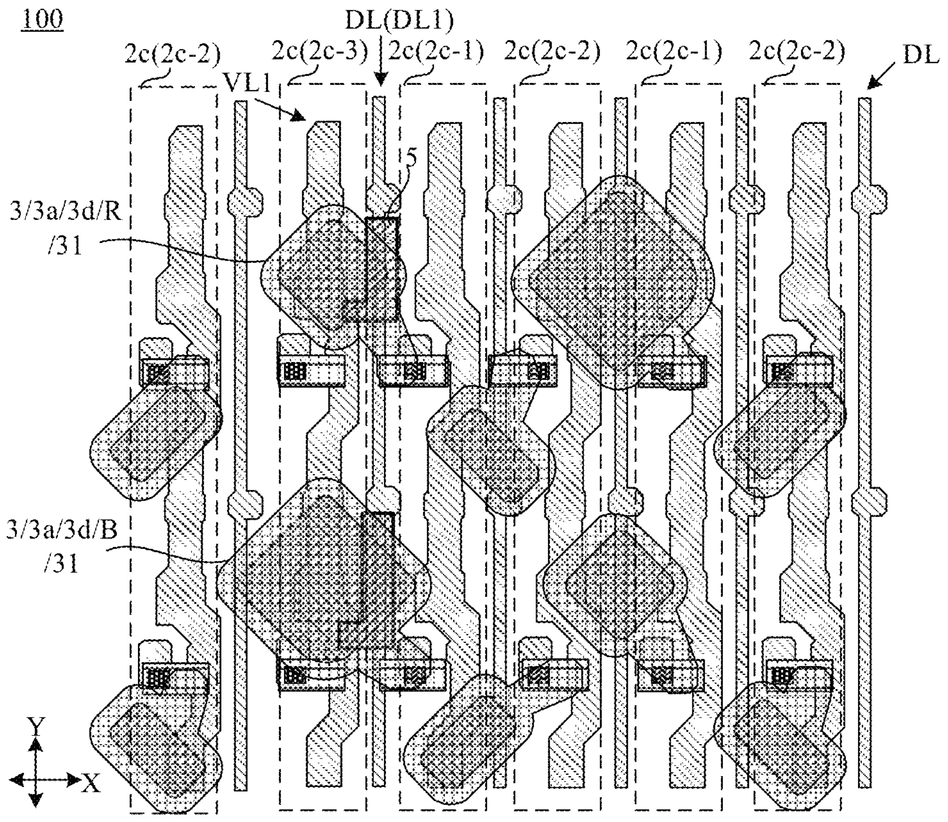
FIG. 20 is a structural diagram of yet another display substrate, in accordance with some embodiments.

As shown in FIGS. 17 and 20, some embodiments of the present disclosure further provide a display substrate 100. In the display substrate 100, an orthographic projection of a first data line DL1 on a plane where the display substrate 100 is located and an orthographic projection of a target light-emitting device 3d on the plane where the display substrate 100 is located overlap partially. That is, in a direction perpendicular to the substrate 1, the first data line DL1 and the target light-emitting device 3d have overlap portions.

The orthographic projection of the first data line DL1 on the plane where the display substrate 100 is located and the orthographic projection of the target light-emitting device 3d on the plane where the display substrate 100 is located overlap partially, which includes but is not limited to, the orthographic projection of the first data line DL1 on the plane where the display substrate 100 is located and an orthographic projection of an anode 31 of the target light-emitting device 3d on the plane where the display substrate 100 is located overlap partially.

Further, as shown in FIGS. 17 and 20, the display substrate 100 further includes a shielding pattern 4 located between the first data line DL1 and the target light-emitting device 3d in a direction perpendicular to the plane where the display substrate 100 is located.

For example, the material of the shielding pattern 4 is a conductive material, and the conductive material includes but is not limited to a metal material. An insulating layer (also referred to as a planarization layer) is provided between the shielding pattern 4 and the first data line DL1, and an insulating layer (also referred to as a planarization layer) is provided between the shielding pattern 4 and the target light-emitting device 3d.

The shielding pattern 4 is configured to receive a constant voltage electrical signal. That is, the shielding pattern 4 has an electric signal with a constant voltage. The constant voltage electrical signal received by the shielding pattern 4 includes but is not limited to a first voltage signal, a first initial signal, a second initial signal, or the like.

In this way, the shielding pattern 4 may be used to shield the target light-emitting device 3d, so as to reduce or even shield an influence of the data signal transmitted by the first data line DL1 on the anode 31 of the target light-emitting device 3d, that is, to reduce or even shield the influence of the data signal transmitted by the first data line DL1 on the potential at the fourth node N4 in the pixel circuit 2 in the first pixel circuit column 2c-1 adjacent to the first data line DL1, thereby improving the stability of the potential at the fourth node N4, improving or even eliminating the bar defects of the display substrate 100, and improving the display effect of the display substrate 100.

In some examples, as shown in FIG. 20, orthographic projections of the shielding pattern 4, the target light-emitting device 3d and the first data line DL1 on the plane where the display substrate 100 is located overlap partially.

That is, in a direction perpendicular to the substrate 1, the first data line DL1, the shielding pattern 4 and the target light-emitting device 3d have overlap portions. An area of the overlap portions of the three is related to the actual wiring situation, and is not limited in the present disclosure.

In this way, it may ensure the shielding pattern 4 to separate overlap portions of the target light-emitting device 3d and the first data line DL1, ensure a good shielding effect of the shielding pattern 4 on the target light-emitting device 3d, and thus effectively reduce or even shield the influence of the data signal transmitted by the first data line DL1 on the anode 31 of the target light-emitting device 3d, and effectively improve the stability of the potential at the fourth node N4.

In some examples, the first color light is red light, the second color light is blue light, and the third color light is green light. A target light-emitting device 3d for emitting red light constitutes a red target light-emitting device R, and a target light-emitting device 3d for emitting blue light constitutes a blue target light-emitting device B. An area of the red target light-emitting device R is less than that of the blue target light-emitting device B.

As shown in FIG. 20, in a direction perpendicular to the plane where the display substrate 100 is located, the shielding pattern 4 is located between the red target light-emitting device R and the first data line DL1. The orthographic projections of the shielding pattern 4, the red target light-emitting device R and the first data line DL1 on the plane where the display substrate 100 is located overlap partially.

That is, the red target light-emitting device R has a relatively small area, and the red target light-emitting device R may extend above the first data line DL1, so that the orthographic projections of the red target light-emitting device R and the first data line DL1 on the plane where the display substrate 100 is located overlap partially.

Of course, since the blue target light-emitting device B has a relatively large area, the blue target light-emitting device B may also extend above the first data line DL1, so that the orthographic projections of the blue target light-emitting device B and the first data line DL1 on the plane where the display substrate 100 is located overlap partially.

There are, for example, a plurality of shielding patterns 4, and the plurality of shielding patterns 4 and the target light-emitting devices 3*d* may be provided in one-to-one correspondence.

For example, the plurality of shielding patterns 4 are disposed in the same layer.

The "same layer" mentioned herein refers to that a film layer for forming specific patterns is formed by using a same film-forming process, and then a patterning process is performed on the film layer by using a same mask to form a layer structure. Depending on different specific patterns, the patterning process may include several exposure, development and etching processes. The specific patterns in the formed layer structure may be continuous or discontinuous, and these specific patterns may also be at different heights or have different thicknesses. In this way, the plurality of shielding patterns 4 may be formed simultaneously, which is helpful to reduce the difficulty in forming the display substrate 100.

For example, in the plurality of shielding patterns 4, at least two shielding patterns 4 are connected to form an integrated structure. The at least two shielding patterns 4 are, for example, at least two shielding patterns 4 adjacent to each other in the first direction X, or at least two shielding patterns 4 adjacent to each other in the second direction Y. Of course, the at least two shielding patterns 4 may also include at least two shielding patterns 4 adjacent to each other in the first direction X and at least two shielding patterns 4 adjacent to each other in the second direction Y.

For example, the plurality of shielding patterns 4 included in the display substrate 100 are of an integrated structure. In this case, the plurality of shielding patterns 4 are in a grid shape.

Here, the "integrated structure" means that at least two connected shielding patterns 4 are continuous and not separated. In this way, the size of the at least two shielding patterns 4 in an integrated structure may increase, thereby reducing the difficulty in etching a film layer where the shielding patterns 4 are located.

In some examples, as shown in FIG. 18, the display substrate 100 includes a first conductive layer FL1 and a second conductive layer FL2. In a direction perpendicular to the substrate 1, the first conductive layer FL1 is located between the plurality of pixel circuits 2 and the plurality of light-emitting devices 3, and the second conductive layer FL2 is located between the first conductive layer FL1 and the plurality of light-emitting devices 3.

The display substrate 100 further includes a plurality of first voltage signal lines VL1, and the plurality of first voltage signal lines VL1 are respectively electrically connected to the plurality of pixel circuit columns 2*c*. For example, the plurality of first voltage signal lines VL1 and the plurality of pixel circuit columns 2*c* are disposed in one-to-one correspondence, and a first voltage signal line VL1 is electrically connected to first voltage signal terminals VDD of each pixel circuit 2 in the corresponding pixel circuit column 2*c*.

For example, the first conductive layer FL1 includes the plurality of data lines DL and the plurality of first voltage signal lines VL1.

Providing the data lines DL and the first voltage signal lines VL1 in the first conductive layer FL1 may be beneficial to increasing a wiring space.

The second conductive layer FL2 includes the shielding patterns 4. For example, the plurality of shielding patterns 4 are all located in the second conductive layer FL2. The shielding pattern 4 is electrically connected to the first voltage signal line VL1 to receive the first voltage signal.

For example, the first voltage signal line VL1 electrically connected to the shielding pattern 4 is, for example, the first voltage signal line VL1 electrically connected to the third pixel circuit column 2*c*-3. Multiple shielding patterns 4 located in the same column are, for example, electrically connected to the same first voltage signal line VL1.

Providing the second conductive layer FL2 between the first conductive layer FL1 and the light-emitting devices 3, and providing the shielding patterns 4 in the second conductive layer FL2 may be beneficial to increasing the wiring space and reducing the wiring difficulty.

Of course, in a case where the data lines DL and the first voltage signal lines VL1 are located in different layers, the shielding patterns 4 and the first voltage signal lines VL1 may be provided in the same layer.

In the above examples, as shown in FIG. 20, the first data line DL1 is, for example, located between the third pixel circuit column 2*c*-3 and the first pixel circuit column 2*c*-1. That is, the first data line DL1 is located on a side of the third pixel circuit column 2*c*-3 proximate to the first pixel circuit column 2*c*-1.

In some embodiments, in combination with FIGS. 3, 6 and 11, in the plurality of light-emitting device columns 3*c* into which the plurality of light-emitting devices 3 in the display substrate 100 are arranged, at least one light-emitting device column 3*c* includes multiple first light-emitting devices 3*a* located in the first display area A1 and multiple second light-emitting devices 3*b* located in the second display area A2.

A data line DL electrically connected to a pixel circuit column 2*c* electrically connected to the multiple first light-emitting devices 3*a* in each light-emitting device column 3*c* in the above at least one light-emitting device column 3*c* is connected to a data line DL electrically connected to a pixel circuit column 2*c* electrically connected to the multiple second light-emitting devices 3*b* in the light-emitting device column 3*c*. The data line DL electrically connected to the pixel circuit column 2*c* electrically connected to the multiple second light-emitting devices 3*b* in the light-emitting device column 3*c* is the first data line DL1.

For example, as shown in FIGS. 6 and 11, the display substrate 100 further includes a plurality of transfer lines 5. The transfer line 5 extends in the first direction and is connected to the data line DL electrically connected to the pixel circuit column 2*c* electrically connected to the multiple first light-emitting devices 3*a* in each light-emitting device column 3*c* and the data line DL electrically connected to the pixel circuit column 2*c* electrically connected to the multiple second light-emitting devices 3*b* in the light-emitting device column 3*c*. That is, in the second direction Y, a data line DL, located on a lower side of the second display area A2, electrically connected to a pixel circuit column 2*c* electrically connected to the first light-emitting devices 3*a* is connected to a data line DL, located on a left or right side of the second display area A2, electrically connected to a pixel circuit column 2c electrically connected to second light-emitting device 3b.

In this way, in the same light-emitting device column 3c, the pixel circuit column 2c electrically connected to the multiple first light-emitting devices 3a and the pixel circuit column 2c electrically connected to the second light-emitting devices 3b may receive the same data signal, so as to facilitate control of the emission states of all the light-emitting devices 3 located in the same light-emitting device column 3c.

In some embodiments, as shown in FIGS. 6 and 11, at least one third pixel circuit column 2c-3 and at least one fourth pixel circuit column 2c-4 are disposed on a side of the second display area A2 in the row direction (i.e., the first direction X).

For example, the plurality of third pixel circuit columns 2c-3 and the plurality of fourth pixel circuit columns 2c-4 included in the display substrate 100 may all be located on the same side (e.g., the left side or the right side) of the second display area A2 in the row direction. Of course, in the plurality of third pixel circuit columns 2c-3, some third pixel circuit columns 2c-3 may be located on a side of two opposite sides of the second display area A2 in the row direction, and the other third pixel circuit columns 2c-3 may be located on the other side of two opposite sides of the second display area A2 in the row direction. In the plurality of fourth pixel circuit columns 2c-4, some fourth pixel circuit columns 2c-4 may be located on a side of two opposite sides of the second display area A2 in the row direction, and the other fourth pixel circuit columns 2c-4 may be located on the other side of two opposite sides of the second display area A2 in the row direction.

This is beneficial to improving the arrangement regularity of the pixel circuits 2, so as to facilitate an electrical connection between the third pixel circuit column 2c-3 and the corresponding second light-emitting devices 3b and facilitate an electrical connection between the fourth pixel circuit column 2c-4 and the corresponding second light-emitting devices 3b.

In some examples, as shown in FIGS. 6 and 11, in the third pixel circuit column 2c-3 and the fourth pixel circuit column 2c-4 that are located on the same side of the second display area A2, the fourth pixel circuit column 2c-4 is closer to the second display area A2 than the third pixel circuit column 2c-3.

That is to say, in the third pixel circuit column 2c-3 and the fourth pixel circuit column 2c-4 that are located on the same side of the second display area A2, each fourth pixel circuit column 2c-4 is located between the third pixel circuit column 2c-3 closest to the second display area A2 and the second display area A2, and each third pixel circuit column 2c-3 is located on a side of the fourth pixel circuit column 2c-4 away from the second display area A2.

For example, FIGS. 6 and 11 show three third pixel circuit columns 2c-3 and three fourth pixel circuit columns 2c-4 that are located on the left side of the second display area A2. The three third pixel circuit columns 2c-3 are located on a side of the three fourth pixel circuit columns 2c-4 away from the second display area A2, and the three fourth pixel circuit columns 2c-4 are located between the three third pixel circuit columns 2c-3 and the second display area A2.

This is beneficial to improving a low grayscale lighting level of the second display area A2.

Figure 21:
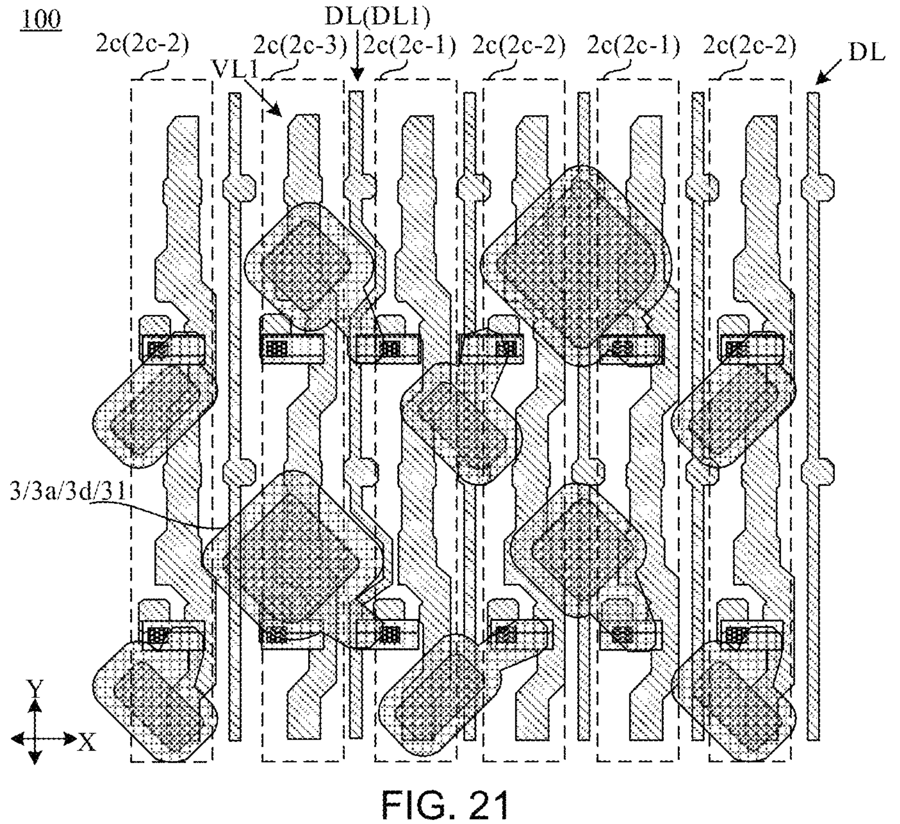
FIG. 21 is a structural diagram of yet another display substrate, in accordance with some embodiments.

As shown in FIGS. 14 and 21, some embodiments of the present disclosure further provide a display substrate 100. In the display substrate 100, an orthographic projection of the first data line DL1 on a plane where the display substrate 100 is located has no overlap with an orthographic projection of the target light-emitting device 3d on the plane where the display substrate 100 is located. The plane where the display substrate 100 is located is parallel to the substrate 1. That is, in a direction perpendicular to the substrate 1, the first data line DL1 and the target light-emitting device 3d are staggered from each other and have no overlap portion.

The light-emitting device 3 includes an anode 31. The orthographic projection of the first data line DL1 on the plane where the display substrate 100 is located having no overlap with the orthographic projection of the target light-emitting device 3d on the plane where the display substrate 100 is located refers to, for example, that the orthographic projection of the first data line DL1 on the plane where the display substrate 100 is located has no overlap with an orthographic projection of an anode 31 of the target light-emitting device 3d on the plane where the display substrate 100 is located.

In this way, a parasitic capacitance between the first data line DL1 and the anode 31 of the target light-emitting device 3d may be reduced, that is, the parasitic capacitance between the first data line DL1 and the fourth node N4 in the pixel circuit 2 in the first pixel circuit column 2c-1 adjacent thereto may be reduced, so as to reduce an influence of the data signal transmitted by the first data line DL1 on the potential at the fourth node N4 in the pixel circuit 2 in the first pixel circuit column 2c-1 adjacent to the first data line DL1, thereby improving or even eliminating the bar defects of the display substrate 100, and improving the display effect of the display substrate 100.

In this case, the arrangement between the target light-emitting device 3d and the first data line DL1 may vary, and may be provided according to actual needs.

For example, as shown in FIGS. 12 and 13, a portion of the first data line DL1 adjacent to the target light-emitting device 3d is in a shape of a straight line. Here, the portion of the first data line DL1 adjacent to the target light-emitting device 3d refers to a portion of the first data line DL1 having an orthographic projection on a plane perpendicular to the first direction X overlapped with an orthographic projection of the anode 31 of the target light-emitting device 3d on the plane perpendicular to the first direction X.

That is, during wiring, the first data line DL1 is provided proximate to the third pixel circuit column 2c-3 electrically connected thereto, and there is enough space for providing the target light-emitting device 3d.

In this way, the regularity of the morphology of the first data line DL1 may be improved, and the difficulty in forming the first data line DL1 may be reduced.

For example, as shown in FIGS. 14 and 21, a portion of the first data line DL1 adjacent to the target light-emitting device 3d wraps around at least a portion of an edge of the target light-emitting device 3d. That is, along a path where the first data line DL1 extends, the portion of the first data line DL1 adjacent to the target light-emitting device 3d bypasses at least the portion of the edge of the target light-emitting device 3d.

For example, the morphology of the portion of the first data line DL1 adjacent to the target light-emitting device 3d is the same as or similar to the morphology of the portion of the edge of the light-emitting device 3d proximate to the first data line DL1. In a direction perpendicular to the plane where the display substrate 100 is located, there is a distance between the portion of the first data line DL1 adjacent to the target light-emitting device 3d and the portion of the edge of the light-emitting device 3*d* proximate to the first data line DL1, and the distance at different positions may be equal or approximately equal.

In the structure shown in FIG. 21, in the first direction X, the first data line DL1 is located on a right side of the target light-emitting device 3*d*, and the portion of the edge of the target light-emitting device 3*d* located on the right side protrudes towards right. Accordingly, a portion of the first data line DL1 adjacent to the target light-emitting device 3*d* protrudes towards right. Of course, as shown in FIG. 14, in a case where the first data line DL1 is located on a left side of the target light-emitting device 3*d*, and the portion of the edge of the target light-emitting device 3*d* located on the left side protrudes towards left, a portion of the first data line DL1 adjacent to the target light-emitting device 3*d* protrudes towards left. That is, during wiring, the first data line DL1 may bypass the target light-emitting device 3*d* by winding.

In this way, the target light-emitting device 3*d* may be avoided, thereby reducing the parasitic capacitance between the first data line DL1 and the anode 31 of the target light-emitting device 3*d*, and even avoiding formation of the parasitic capacitance between the first data line DL1 and the anode 31 of the target light-emitting device 3*d*.

In the above examples, as shown in FIG. 14, an orthographic projection of the first light-emitting device 3*a* electrically connected to the second pixel circuit column 2*c*-2 adjacent to the third pixel circuit column 2*c*-3 on a plane where the display substrate 100 is located and an orthographic projection of the first data line DL1 on the plane where the display substrate 100 is located overlap partially.

Of course, as shown in FIG. 21, an orthographic projection of the first light-emitting device 3*a* electrically connected to the second pixel circuit column 2*c*-2 adjacent to the third pixel circuit column 2*c*-3 on a plane where the display substrate 100 is located and an orthographic projection of the first data line DL1 on the plane where the display substrate 100 is located may have no overlap.

In some embodiments, in combination with FIGS. 3, 6 and 11, in the plurality of light-emitting device columns 3*c* into which the plurality of light-emitting devices 3 in the display substrate 100 are arranged, at least one light-emitting device column 3*c* includes multiple first light-emitting devices 3*a* located in the first display area A1 and multiple second light-emitting devices 3*b* located in the second display area A2.

A data line DL electrically connected to a pixel circuit column 2*c* electrically connected to the multiple first light-emitting devices 3*a* in each light-emitting device column 3*c* in the above at least one light-emitting device column 3*c* is connected to a data line DL electrically connected to a pixel circuit column 2*c* electrically connected to the multiple second light-emitting devices 3*b* in the light-emitting device column 3*c*.

This facilitates control of the emission states of all the light-emitting devices 3 located in the same light-emitting device column 3*c*.

For example, as shown in FIGS. 6 and 11, the display substrate 100 further includes a plurality of transfer lines 5. The transfer line 5 extends in the first direction and is connected to the data line DL electrically connected to the pixel circuit column 2*c* electrically connected to the multiple first light-emitting devices 3*a* in each light-emitting device column 3*c* and the data line DL electrically connected to the pixel circuit column 2*c* electrically connected to the multiple second light-emitting devices 3*b* in the light-emitting device column 3*c*.

In some embodiments, as shown in FIGS. 6 and 11, at least one third pixel circuit column 2*c*-3 and at least one fourth pixel circuit column 2*c*-4 are disposed on a side of the second display area A2 in the row direction (i.e., the first direction X).

For example, the plurality of third pixel circuit columns 2*c*-3 and the plurality of fourth pixel circuit columns 2*c*-4 included in the display substrate 100 may all be located on the same side (e.g., the left side or the right side) of the second display area A2 in the row direction. Of course, in the plurality of third pixel circuit columns 2*c*-3, some third pixel circuit columns 2*c*-3 may be located on a side of two opposite sides of the second display area A2 in the row direction, and the other third pixel circuit columns 2*c*-3 may be located on the other side of two opposite sides of the second display area A2 in the row direction. In the plurality of fourth pixel circuit columns 2*c*-4, some fourth pixel circuit columns 2*c*-4 may be located on a side of two opposite sides of the second display area A2 in the row direction, and the other fourth pixel circuit columns 2*c*-4 may be located on the other side of two opposite sides of the second display area A2 in the row direction.

This is beneficial to improving the arrangement regularity of the pixel circuits 2, so as to facilitate an electrical connection between the third pixel circuit column 2*c*-3 and the corresponding second light-emitting devices 3*b* and facilitate an electrical connection between the fourth pixel circuit column 2*c*-4 and the corresponding second light-emitting devices 3*b*.

In some examples, as shown in FIGS. 6 and 11, in the third pixel circuit column 2*c*-3 and the fourth pixel circuit column 2*c*-4 that are located on the same side of the second display area A2, the fourth pixel circuit column 2*c*-4 is closer to the second display area A2 than the third pixel circuit column 2*c*-3.

That is to say, in the third pixel circuit column 2*c*-3 and the fourth pixel circuit column 2*c*-4 that are located on the same side of the second display area A2, each fourth pixel circuit column 2*c*-4 is located between the third pixel circuit column 2*c*-3 closest to the second display area A2 and the second display area A2, and each third pixel circuit column 2*c*-3 is located on a side of the fourth pixel circuit column 2*c*-4 away from the second display area A2.

For example, FIGS. 6 and 11 show three third pixel circuit columns 2*c*-3 and three fourth pixel circuit columns 2*c*-4 that are located on the left side of the second display area A2. The three third pixel circuit columns 2*c*-3 are located on a side of the three fourth pixel circuit columns 2*c*-4 away from the second display area A2, and the three fourth pixel circuit columns 2*c*-4 are located between the three third pixel circuit columns 2*c*-3 and the second display area A2.

This is beneficial to improving a low grayscale lighting level of the second display area A2.

The foregoing descriptions are merely specific implementations of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

The invention claimed is:

1. A display substrate having a first display area and a second display area, the first display area being located on at least one side of the second display area; the display substrate comprising:

a plurality of light-emitting devices including a plurality of first light-emitting devices located in the first display area and a plurality of second light-emitting devices located in the second display area;

a plurality of pixel circuits located in the first display area and electrically connected to the plurality of light-emitting devices, wherein the plurality of pixel circuits are arranged into a plurality of pixel circuit columns, the plurality of pixel circuit columns include a plurality of first pixel circuit columns and a plurality of second pixel circuit columns electrically connected to the plurality of first light-emitting devices, and a plurality of third pixel circuit columns and a plurality of fourth pixel circuit columns electrically connected to the plurality of second light-emitting devices; the plurality of first pixel circuit columns and the plurality of second pixel circuit columns are alternately disposed in a row direction, at least one third pixel circuit column in the plurality of third pixel circuit columns or at least one fourth pixel circuit column in the plurality of fourth pixel circuit columns is located between a first pixel circuit column and a second pixel circuit column that are adjacent; the first pixel circuit column or the third pixel circuit column is configured to drive corresponding light-emitting devices to emit a first color light and a second color light, and the second pixel circuit column or the fourth pixel circuit column is configured to drive corresponding light-emitting devices to emit a third color light; and a plurality of data lines located in the first display area and electrically connected to the plurality of pixel circuit columns, wherein the plurality of data lines include a first data line electrically connected to one of the at least one third pixel circuit column, and the first data line is located between the third pixel circuit column and the second pixel circuit column.

2. The display substrate according to claim 1, wherein first light-emitting devices electrically connected to the first pixel circuit column adjacent to the third pixel circuit column constitute target light-emitting devices; and an orthographic projection of the first data line on a plane where the display substrate is located and an orthographic projection of one of the target light-emitting devices on the plane where the display substrate is located have no overlap.

3. The display substrate according to claim 2, wherein a portion of the first data line adjacent to the target light-emitting device is in a shape of a straight line; or a portion of the first data line adjacent to the target light-emitting device bypasses at least a portion of an edge of the target light-emitting device.

4. The display substrate according to claim 1, wherein first light-emitting devices electrically connected to the first pixel circuit column adjacent to the third pixel circuit column constitute target light-emitting devices;

an orthographic projection of the first data line on a plane where the display substrate is located and an orthographic projection of one of the target light-emitting devices on the plane where the display substrate is located overlap partially; and the display substrate further comprises shielding patterns, one of the shielding patterns is located between the first data line and the target light-emitting device in a direction perpendicular to the plane where the display substrate is located, and the shielding pattern is configured to receive a constant voltage electrical signal.

5. The display substrate according to claim 4, wherein orthographic projections of the shielding pattern, the target light-emitting device and the first data line on the plane where the display panel is located overlap partiallyy; and/or at least two shielding patterns are connected to be of an integrated structure.

6. The display substrate according to claim 4, wherein the first color light is a red light, a second color light is a blue light, and a third color light is a green light;

a target light-emitting device for emitting the red light constitutes a red target light-emitting device, a target light-emitting device for emitting the blue light constitutes a blue target light-emitting device, and an area of the red target light-emitting device is less than that of the blue target light-emitting device; and in the direction perpendicular to the plane where the display substrate is located, the shielding pattern is located between the blue target light-emitting device and the first data line; and orthographic projections of the shielding pattern, the blue target light-emitting device and the first data line on the plane where the display substrate is located overlap partially.

7. The display substrate according to claim 4, further comprising: a plurality of first voltage signal lines located in the first display area, the plurality of first voltage signal lines being respectively electrically connected to the plurality of pixel circuit columns; wherein the display substrate comprising:

a first conductive layer including the plurality of data lines and the plurality of first voltage signal lines; and a second conductive layer located between the first conductive layer and the plurality of light-emitting devices, wherein the second conductive layer includes the shielding patterns, and the shielding pattern is electrically connected to at least one first voltage signal line in the plurality of first voltage signal lines.

8. The display substrate according to claim 1, wherein an orthographic projection of a first light-emitting device electrically connected to the second pixel circuit column adjacent to the third pixel circuit column on a plane where the display substrate is located and an orthographic projection of the first data line on the plane where the display substrate is located overlap partially.

9. The display substrate according to claim 1, wherein the plurality of light-emitting devices are arranged in a plurality of light-emitting device columns; at least one light-emitting device column includes multiple first light-emitting devices located in the first display area and multiple second light-emitting devices located in the second display area; and a data line electrically connected to a pixel circuit column electrically connected to multiple first light-emitting devices in each light-emitting device column in the at least one light-emitting device column is connected to a data line electrically connected to a pixel circuit column electrically connected to de-multiple second light-emitting devices in the light-emitting device column in the at least one light-emitting device column.

10. The display substrate according to claim 1, wherein at least one third pixel circuit column and at least one fourth pixel circuit column are disposed on a side of the second display area in the row direction; and the fourth pixel circuit column is closer to the second display area than the third pixel circuit column.

11. A display apparatus, comprising:

the display substrate according to claim 1; and an optical element located on a non-light-exit side of the display substrate, wherein the optical element is at least partially located in the second display area of the display substrate.

12. A display substrate having a first display area and a second display area, the first display area being located on at least one side of the second display area; the display substrate comprising:

a plurality of light-emitting devices including a plurality of first light-emitting devices located in the first display area and a plurality of second light-emitting devices located in the second display area;

a plurality of pixel circuits located in the first display area and electrically connected to the plurality of light-emitting devices, wherein the plurality of pixel circuits are arranged into a plurality of pixel circuit columns, the plurality of pixel circuit columns include a plurality of first pixel circuit columns and a plurality of second pixel circuit columns electrically connected to the plurality of first light-emitting devices, and a plurality of third pixel circuit columns and a plurality of fourth pixel circuit columns electrically connected to the plurality of second light-emitting devices; the plurality of first pixel circuit columns and the plurality of second pixel circuit columns are alternately disposed in a row direction, at least one third pixel circuit column in the plurality of third pixel circuit columns or at least one fourth pixel circuit column in the plurality of fourth pixel circuit columns is located between a first pixel circuit column and a second pixel circuit column that are adjacent; the first pixel circuit column or the third pixel circuit column is configured to drive corresponding light-emitting devices to emit a first color light and a second color light, and the second pixel circuit column or the fourth pixel circuit column is configured to drive corresponding light-emitting devices to emit a third color light; and a plurality of data lines located in the first display area and electrically connected to the plurality of pixel circuit columns, wherein the plurality of data lines include a first data line electrically connected to one of the at least one third pixel circuit column, and first light-emitting devices electrically connected to the first pixel circuit column adjacent to the third pixel circuit column constitute target light-emitting devices; and an orthographic projection of the first data line on a plane where the display substrate is located and an orthographic projection of one of the target light-emitting devices on the plane where the display substrate is located overlap partially; and shielding patterns, wherein one of the shielding patterns is located between the first data line and the target light-emitting device in a direction perpendicular to the plane where the display substrate is located, and the shielding pattern is configured to receive a constant voltage electrical signal.

13. The display substrate according to claim 12, wherein orthographic projections of the shielding pattern, the target light-emitting device and the first data line on the plane where the display panel is located overlap partially; and/or at least two shielding patterns are connected to be of an integrated structure.

14. The display substrate according to claim 12, wherein the first color light is a red light, a second color light is a blue light, and a third color light is a green light;

a target light-emitting device for emitting the red light constitutes a red target light-emitting device, a target light-emitting device for emitting the blue light constitutes a blue target light-emitting device, and an area of the red target light-emitting device is less than an area of the blue target light-emitting device; and in the direction perpendicular to the plane where the display substrate is located, the shielding pattern is located between the red target light-emitting device and the first data line;

and orthographic projections of the shielding pattern, the red target light-emitting device and the first data line on the plane where the display substrate is located overlap partially.

15. The display substrate according to claim 12, further comprising: a plurality of first voltage signal lines located in the first display area, the plurality of first voltage signal lines being respectively electrically connected to the plurality of pixel circuit columns; wherein the display substrate comprising:

a first conductive layer including the plurality of data lines and the plurality of first voltage signal lines; and a second conductive layer located between the first conductive layer and the plurality of light-emitting devices, wherein the second conductive layer includes the shielding patterns, and the shielding pattern is electrically connected to at least one first voltage signal line in the plurality of first voltage signal lines.

16. The display substrate according to claim 12, wherein the first data line is located between the third pixel circuit column and the first pixel circuit column; and/or at least one third pixel circuit column and at least one fourth pixel circuit column are disposed on a side of the second display area in the row direction; and the fourth pixel circuit column is closer to the second display area than the third circuit column.

17. The display substrate according to claim 12, wherein the plurality of light-emitting devices are arranged in a plurality of light-emitting device columns; at least one light-emitting device column includes multiple first light-emitting devices located in the first display area and multiple second light-emitting devices located in the second display area; and a data line electrically connected to a pixel circuit column electrically connected to multiple first light-emitting devices in each light-emitting device column in the at least one light-emitting device column is connected to a data line electrically connected to a pixel circuit column electrically connected to multiple second light-emitting devices in the light-emitting device column in the at least one light-emitting device column.

18. A display substrate having a first display area and a second display area, the first display area being located on at least one side of the second display area; the display substrate comprising:

a plurality of light-emitting devices including a plurality of first light-emitting devices located in the first display area and a plurality of second light-emitting devices located in the second display area;

a plurality of pixel circuits located in the first display area and electrically connected to the plurality of light-emitting devices, wherein the plurality of pixel circuits are arranged into a plurality of pixel circuit columns, the plurality of pixel circuit columns include a plurality of first pixel circuit columns and a plurality of second pixel circuit columns electrically connected to the plurality of first light-emitting devices, and a plurality of third pixel circuit columns and a plurality of fourth pixel circuit columns electrically connected to the plurality of second light-emitting devices; the plurality of first pixel circuit columns and the plurality of second pixel circuit columns are alternately disposed in a row direction, at least one third pixel circuit column in the plurality of third pixel circuit columns or at least one fourth pixel circuit column in the plurality of fourth pixel circuit columns is located between a first pixel circuit column and a second pixel circuit column that are adjacent; the first pixel circuit column or the third pixel circuit column is configured to drive corresponding light-emitting devices to emit a first color light and a second color light, and the second pixel circuit column or the fourth pixel circuit column is configured to drive corresponding light-emitting devices to emit a third color light; and a plurality of data lines located in the first display area and electrically connected to the plurality of pixel circuit columns, wherein the plurality of data lines include a first data line electrically connected to one of the at least one third pixel circuit column, and first light-emitting devices electrically connected to the first pixel circuit column adjacent to the third pixel circuit column constitute target light-emitting devices, wherein an orthographic projection of the first data line on a plane where the display substrate is located and an orthographic projection of one of the target light-emitting devices on the plane where the display substrate is located have no overlap.

19. The display substrate according to claim 18, wherein an orthographic projection of a first light-emitting device electrically connected to the second pixel circuit column adjacent to the third pixel circuit column on a plane where the display substrate is located and an orthographic projection of the first data line on the plane where the display substrate is located overlap partially.

20. The display substrate according to claim 18, the plurality of light-emitting devices are arranged in a plurality of light-emitting device columns; at least one light-emitting device column multiple first light-emitting devices located in the first display area and multiple second light-emitting devices located in the second display area; and a data line electrically connected to a pixel circuit column electrically connected to multiple first light-emitting devices in each light-emitting device column in the at least one light-emitting device column is connected to a data line electrically connected to a pixel circuit column electrically connected to multiple second light-emitting devices in the light-emitting device column in the at least one light-emitting device column.

* * * * *